（12） United States Patent
Nakatsuka

(10) Patent No.: US 9,190,452 B2
(45) Date of Patent: Nov. 17, 2015

(54) SEMICONDUCTOR MEMORY DEVICE

(71) Applicant: Keisuke Nakatsuka, Seoul (KR)

(72) Inventor: Keisuke Nakatsuka, Seoul (KR)

( * ) Notice: Subject to any disclaimer, the term of this patent is extended or adjusted under 35 U.S.C. 154(b) by 94 days.

(21) Appl. No.: 13/965,118

(22) Filed: Aug. 12, 2013

(65) Prior Publication Data

US 2014/0319590 A1    Oct. 30, 2014

Related U.S. Application Data

(60) Provisional application No. 61/816,134, filed on Apr. 25, 2013.

(51) Int. Cl.
  *H01L 29/82*   (2006.01)
  *H01L 43/00*   (2006.01)
  *H01L 27/22*   (2006.01)
(52) U.S. Cl.
  CPC .................................... *H01L 27/228* (2013.01)
(58) Field of Classification Search
  CPC ......................... H01L 27/228; H01L 27/222
  USPC ......................................... 257/295, 421, 422
  See application file for complete search history.

(56) References Cited

U.S. PATENT DOCUMENTS

| 2008/0209118 A1 | 8/2008 | Kajiyama |
| 2012/0080725 A1 | 4/2012 | Manos et al. |
| 2013/0056698 A1* | 3/2013 | Satoh et al. .................. 257/2 |

FOREIGN PATENT DOCUMENTS

| JP | 2006-186109 A | 7/2006 |
| JP | 2011114316 A | 6/2011 |
| JP | 2013069753 A | 4/2013 |

OTHER PUBLICATIONS

International Search Report including Written Opinion dated Jun. 24, 2014, issued in parent International Application No. PCT/JP2014/057639.

* cited by examiner

*Primary Examiner* — Thien F Tran
(74) *Attorney, Agent, or Firm* — Holtz, Holtz, Goodman & Chick PC

(57) ABSTRACT

According to one embodiment, a semiconductor memory device comprises a semiconductor substrate including a plane portion expanding in a first direction and a second direction perpendicular to the first direction, and a pillar portion formed on an upper surface of the plane portion and extending in a stacking direction, a first gate electrode formed on a first gate insulating layer on a lower side surface of the pillar portion, and extending in the first direction, a second gate electrode formed on a second gate insulating layer on an upper side surface of the pillar portion, and extending in the second direction, a variable-resistance element formed on an upper surface of the pillar portion, and an interconnection formed on an upper surface of the variable-resistance element.

9 Claims, 35 Drawing Sheets

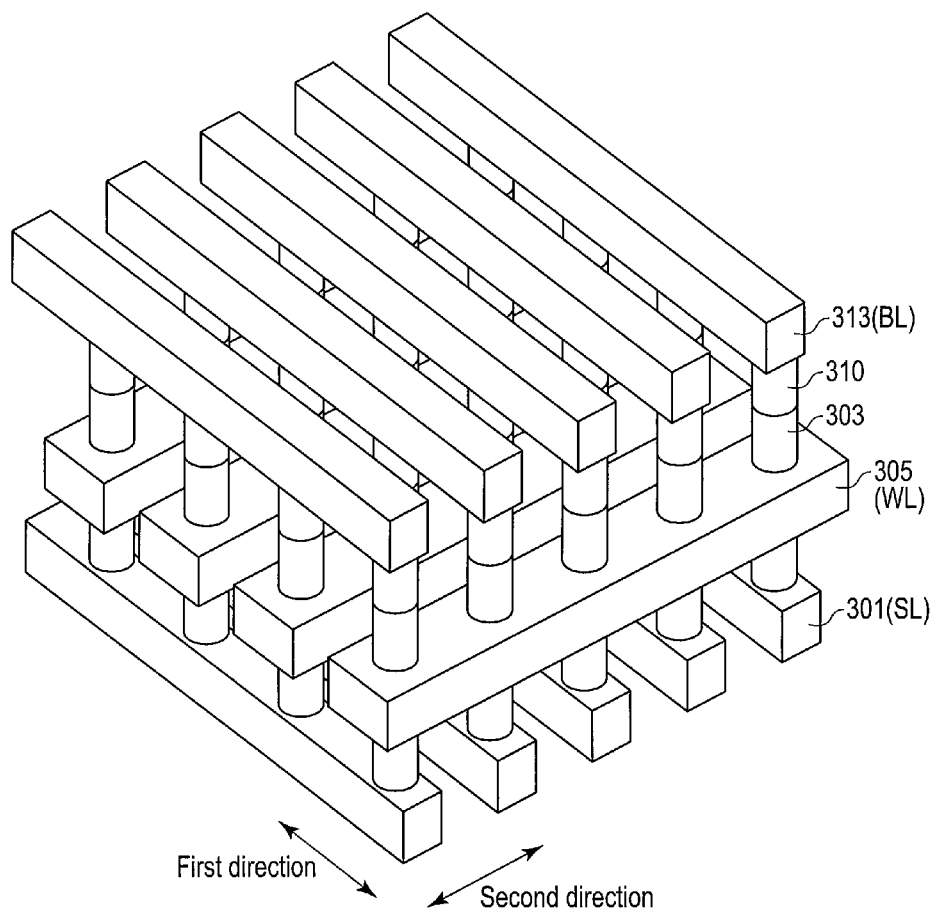
F I G. 1

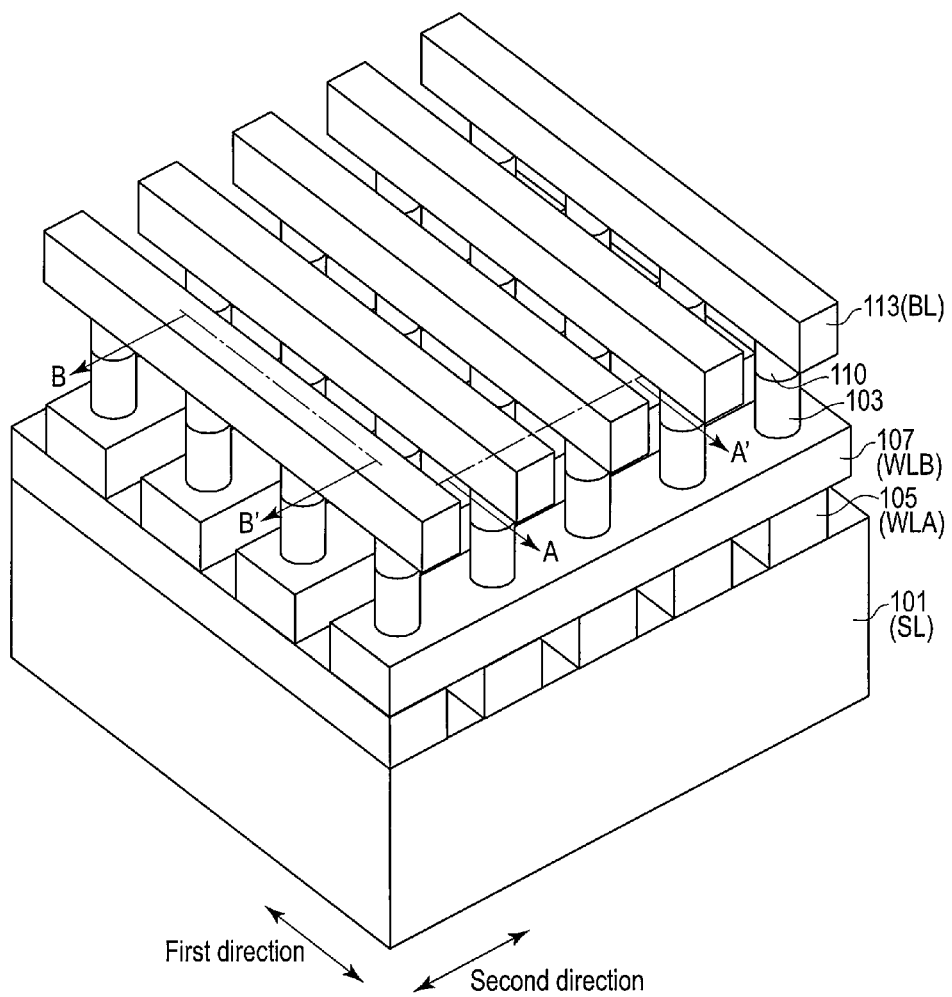
F I G. 2

Parallel state (low resistance)

Antiparallel state (high resistance)

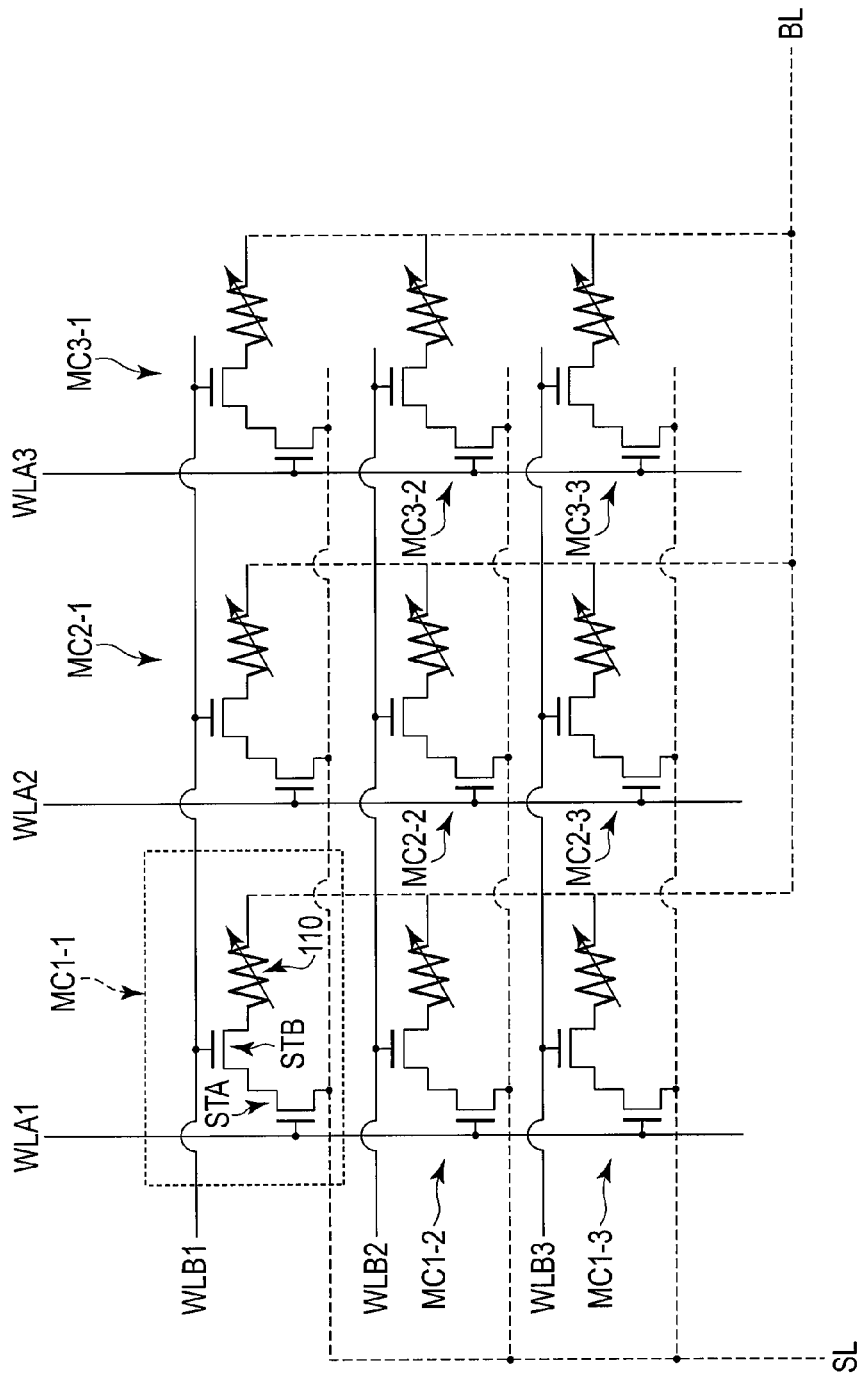
F I G. 5

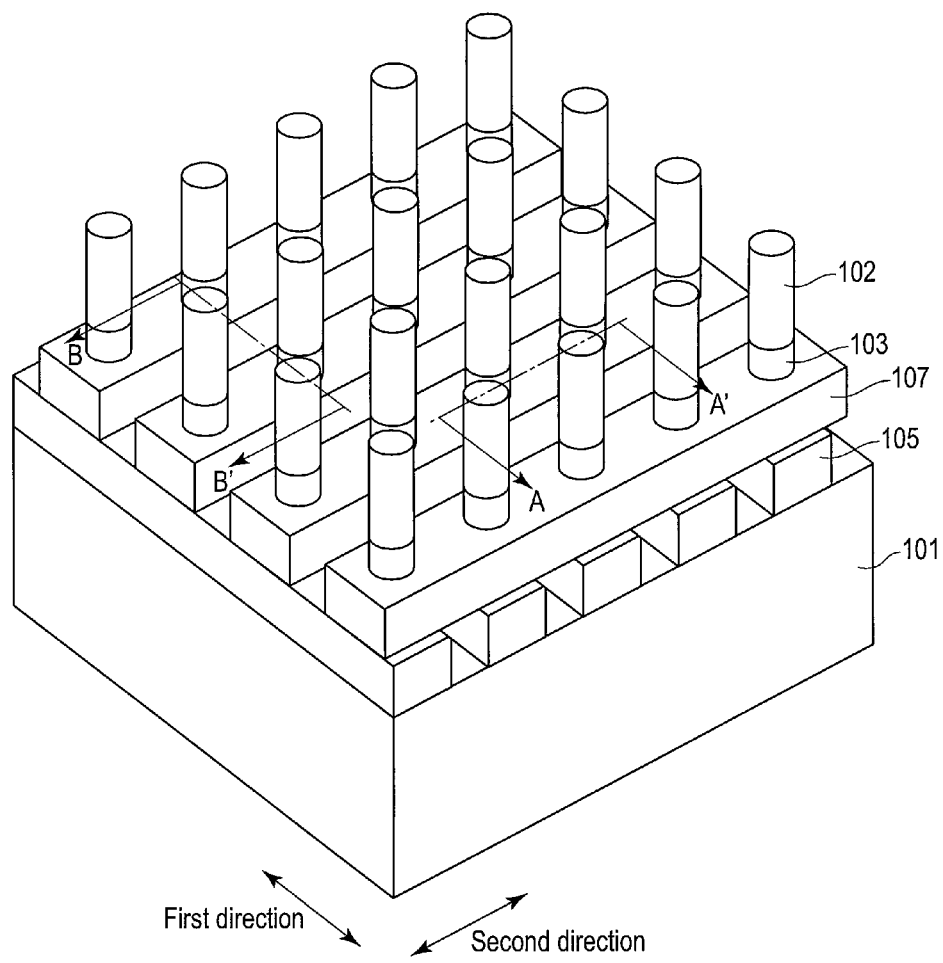
F I G. 10

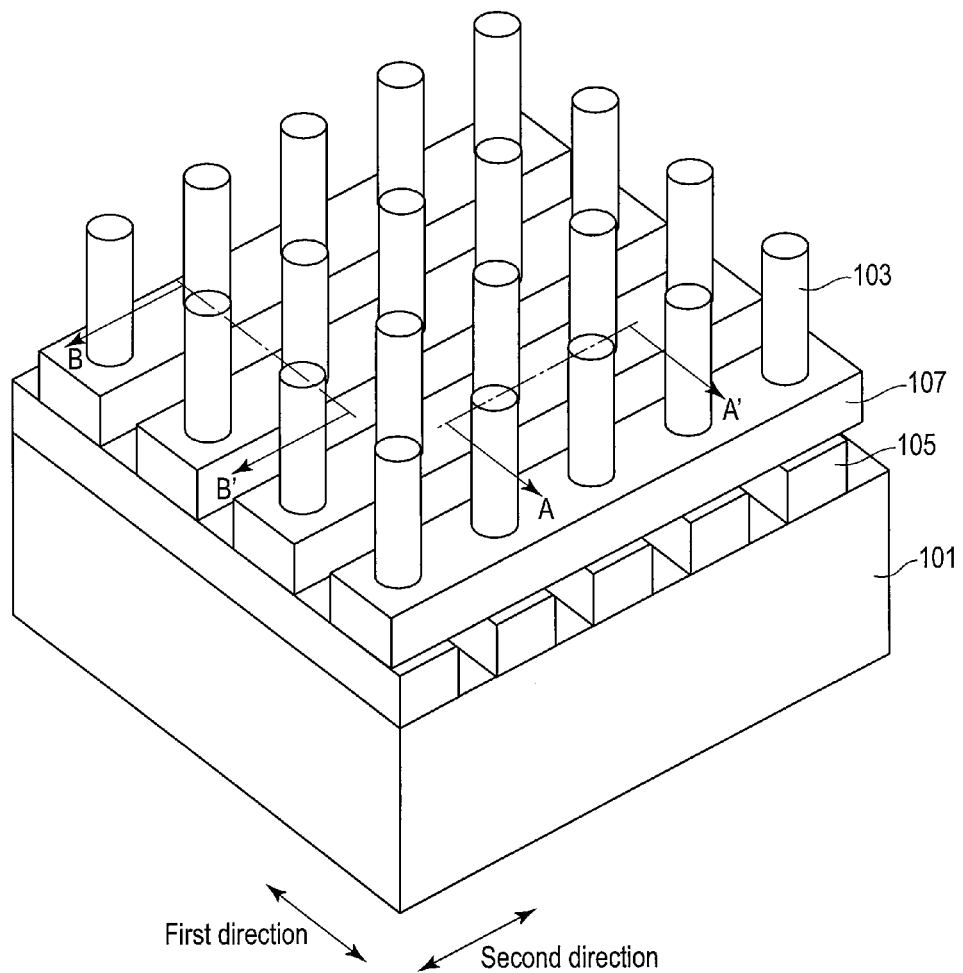
F I G. 12

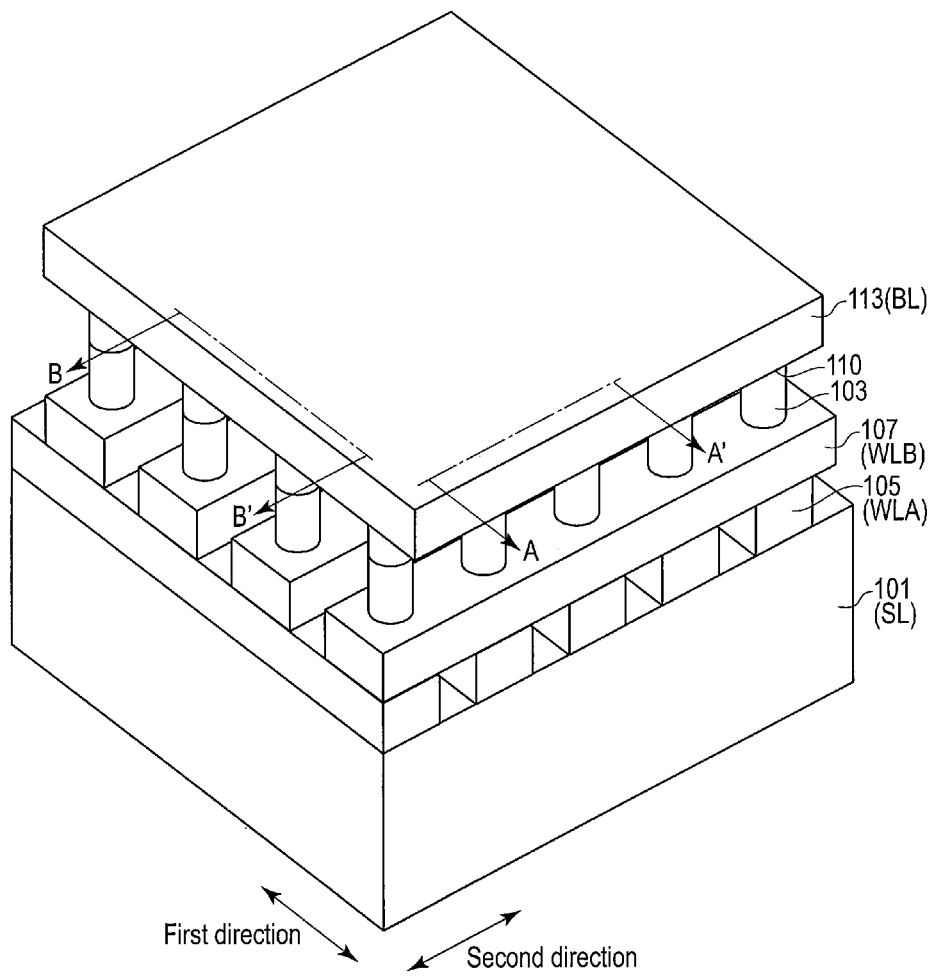
F I G. 17

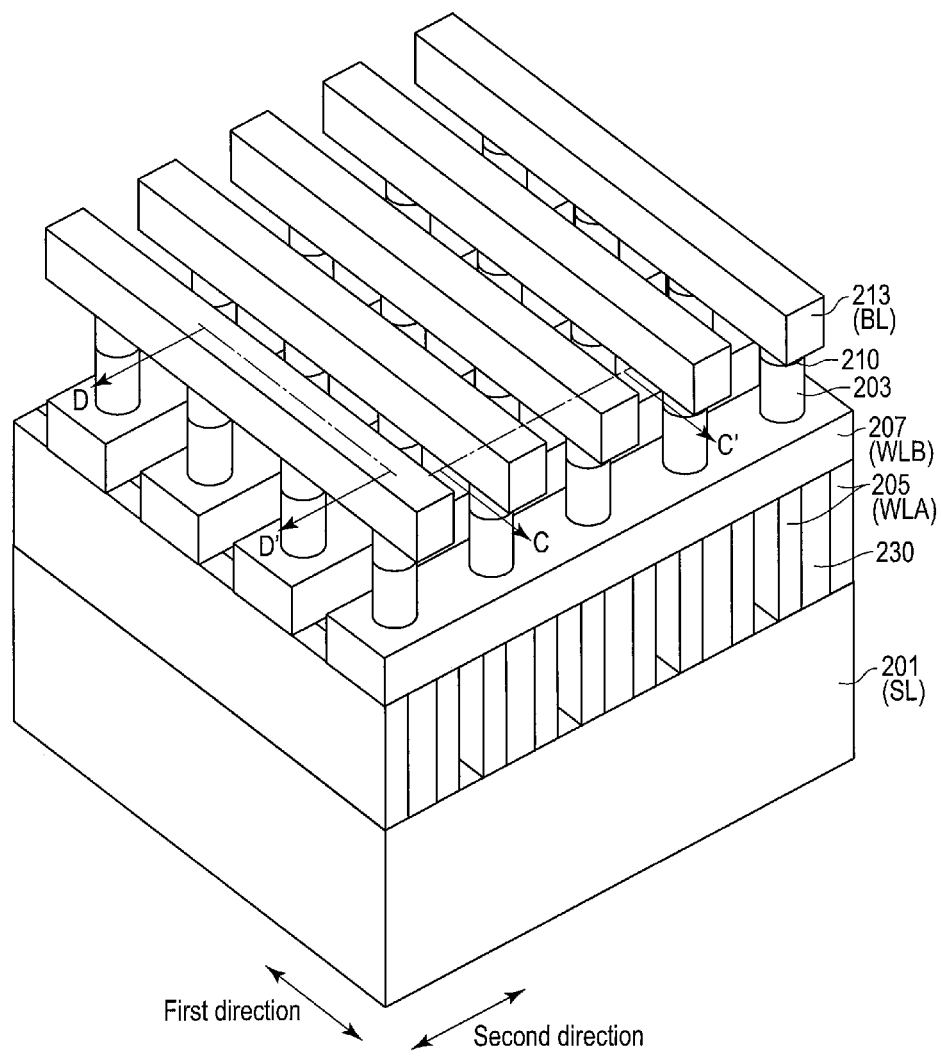
F I G. 19

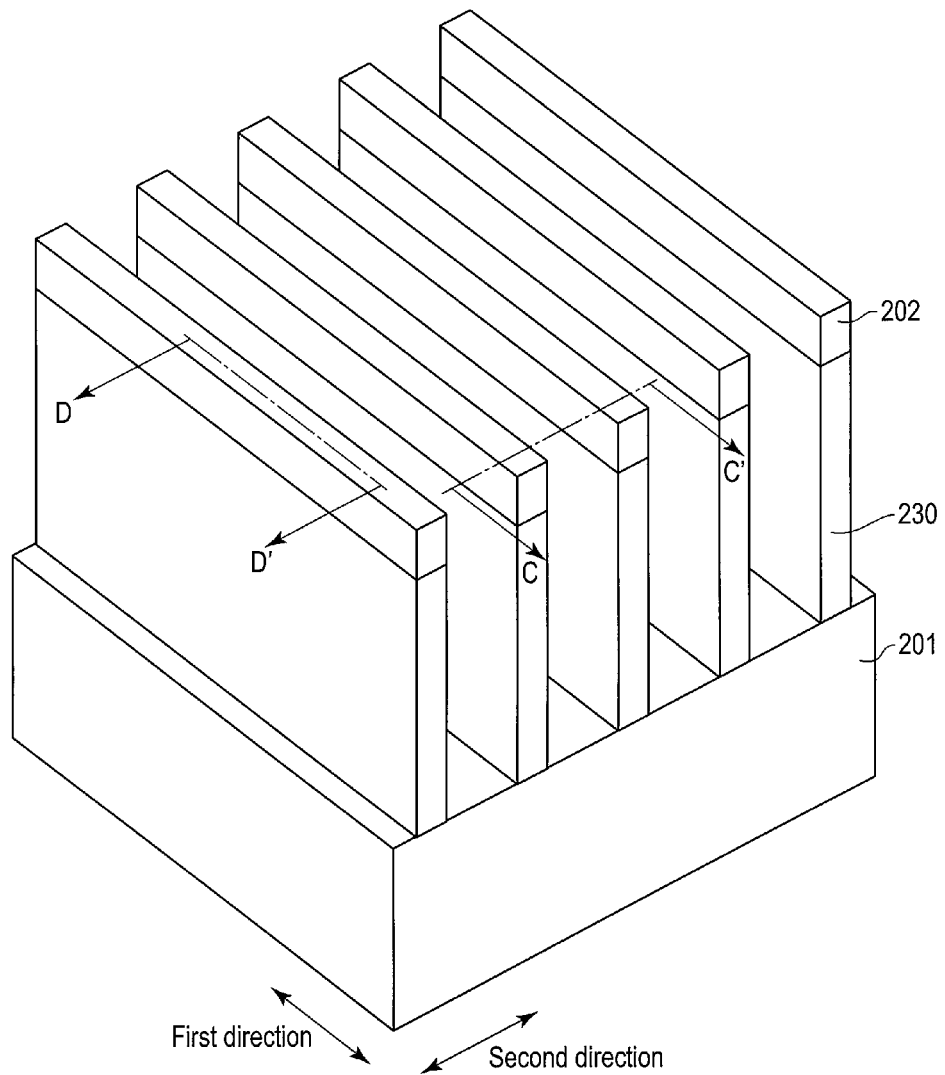
F I G. 21

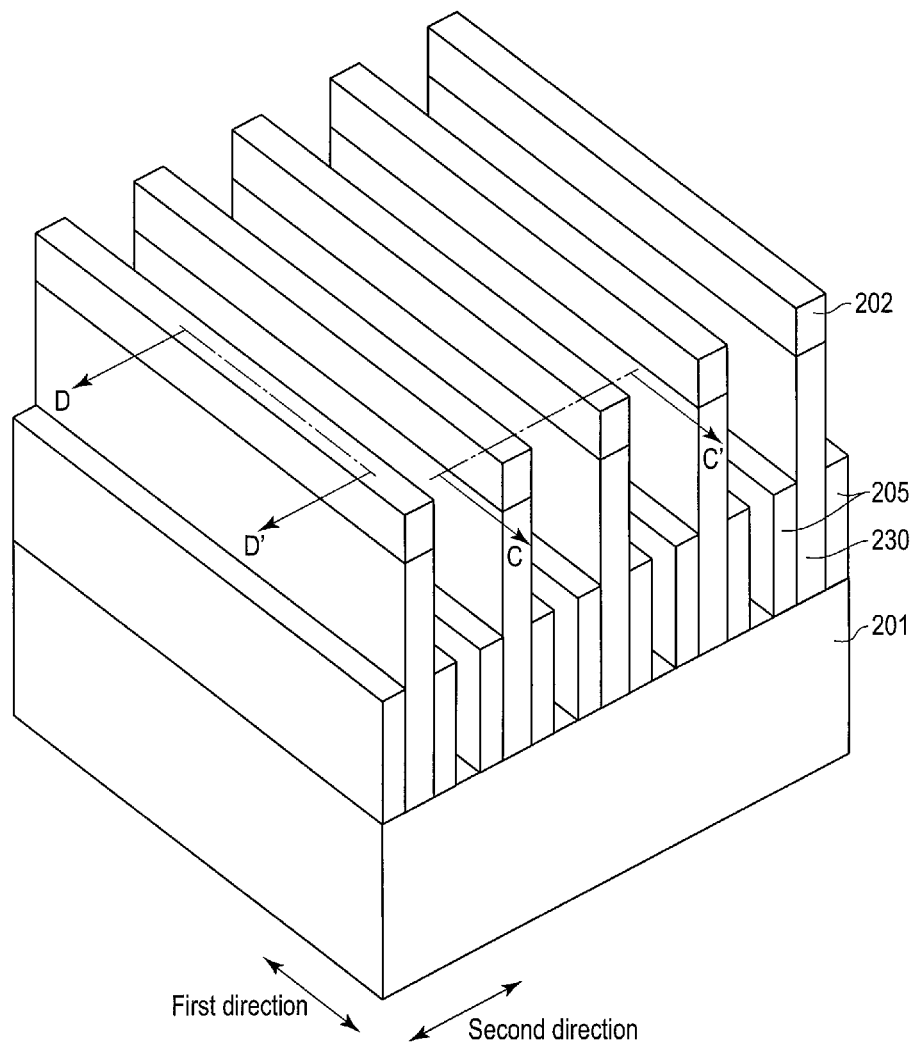
F I G. 23

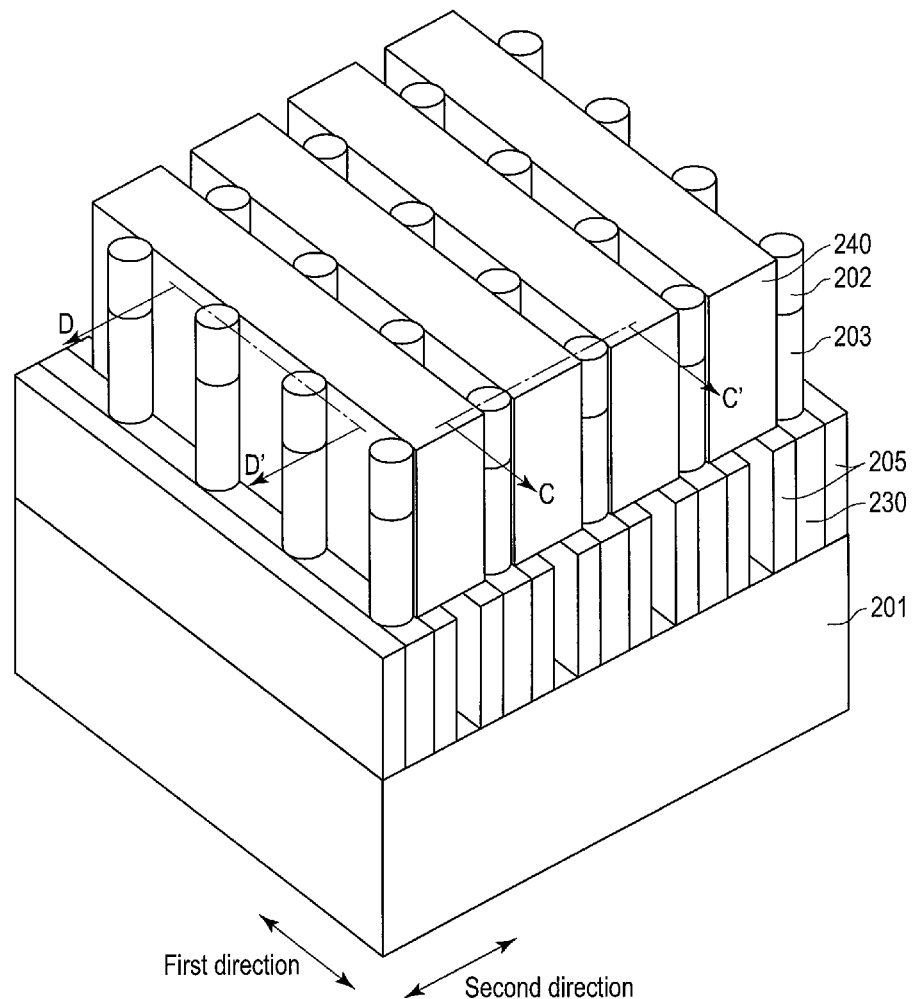
F I G. 25

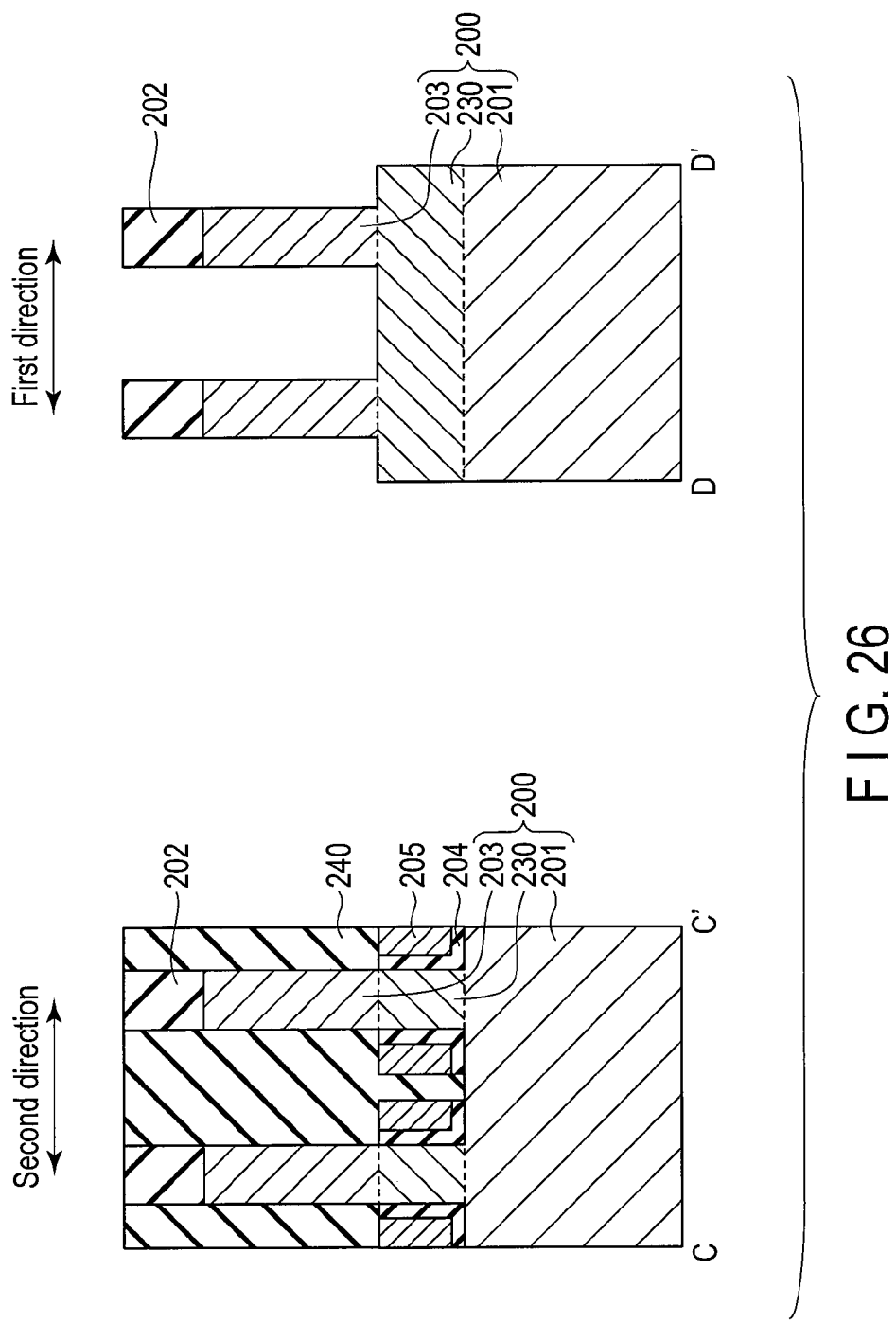
F I G. 26

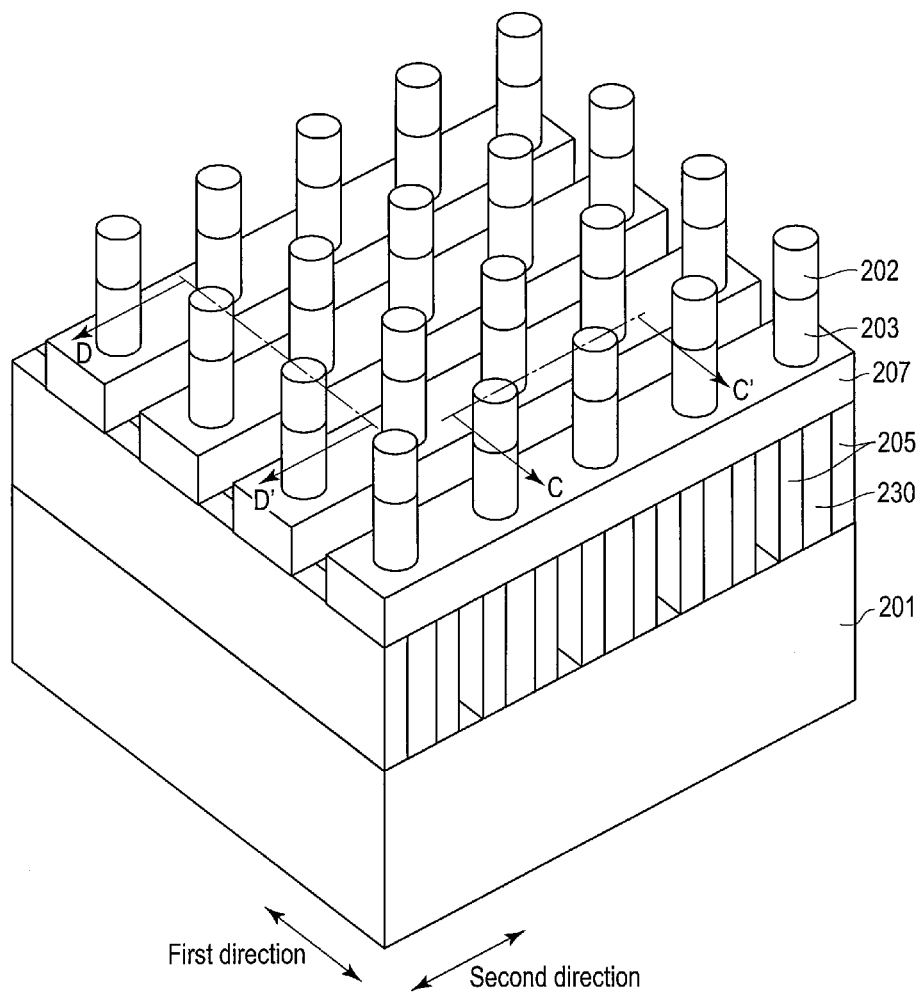
F I G. 27

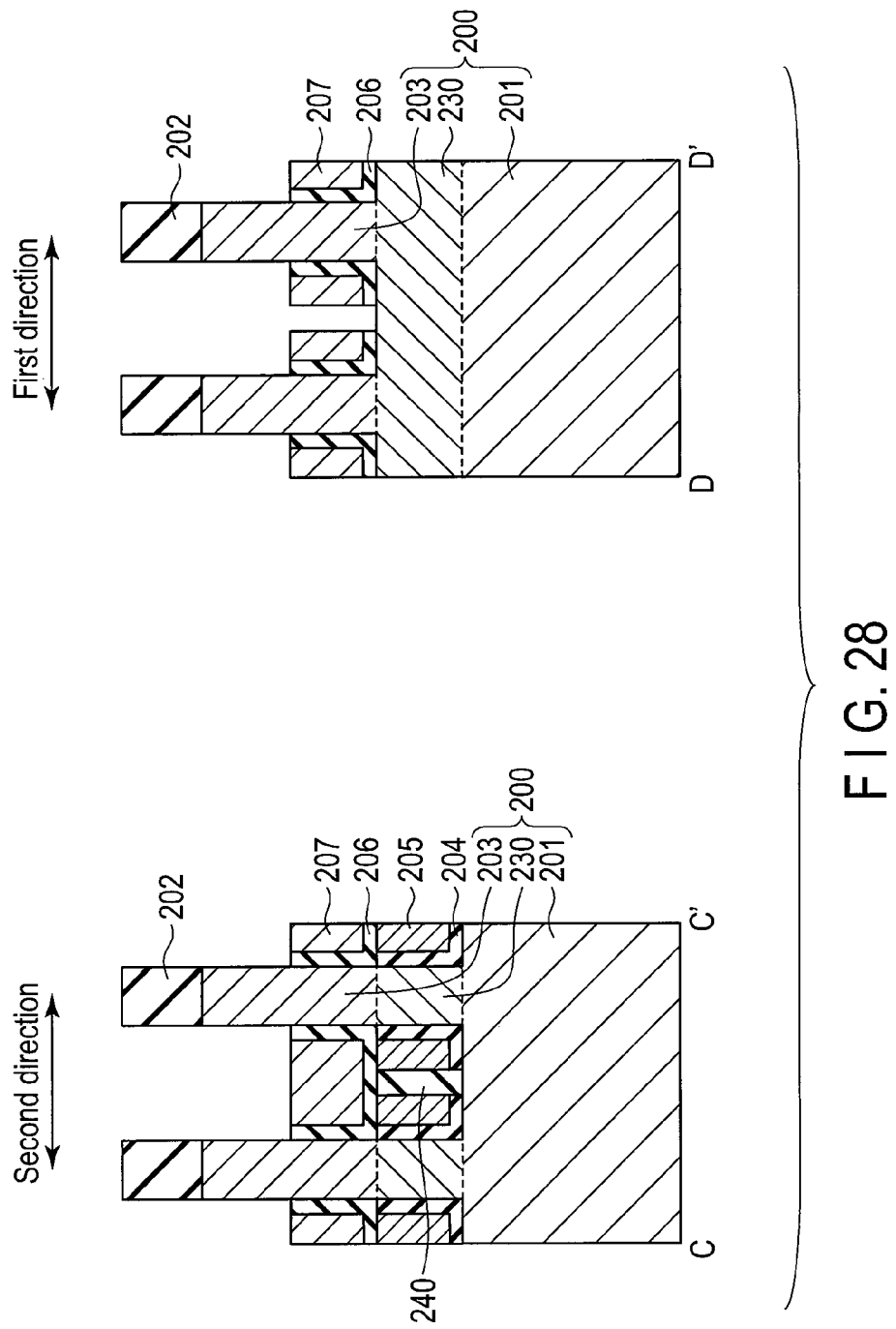
F I G. 28

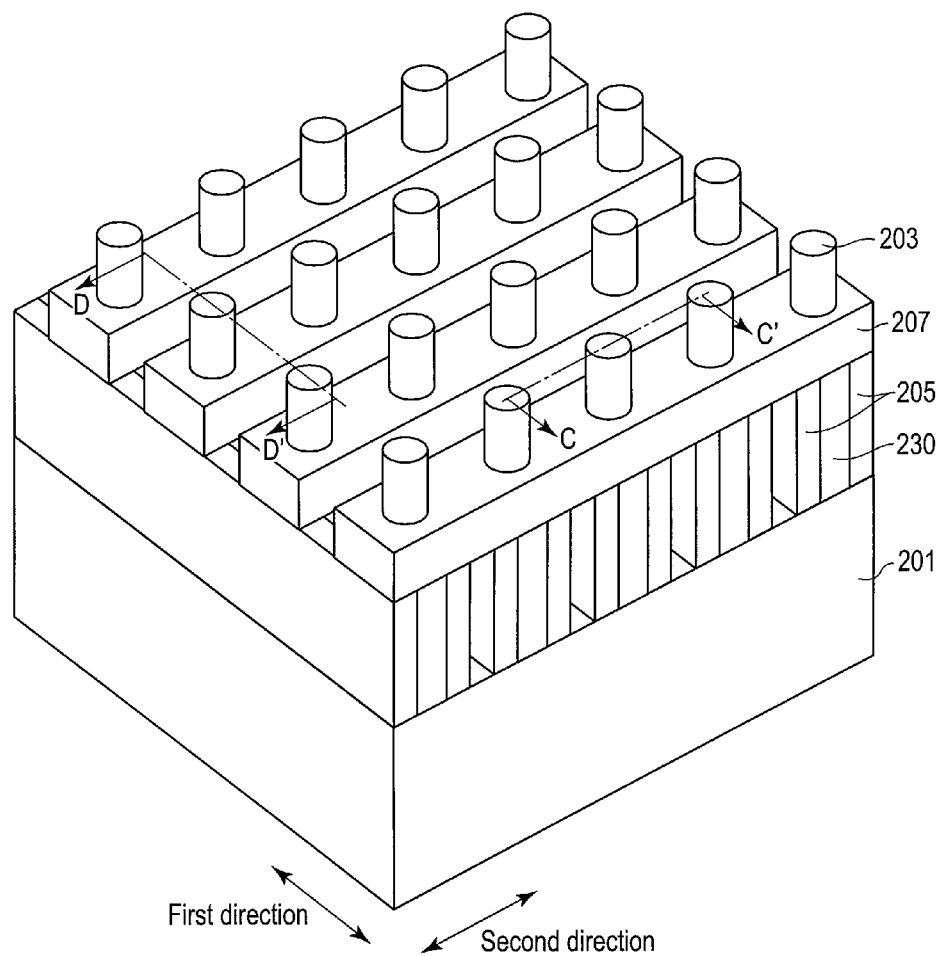
F I G. 29

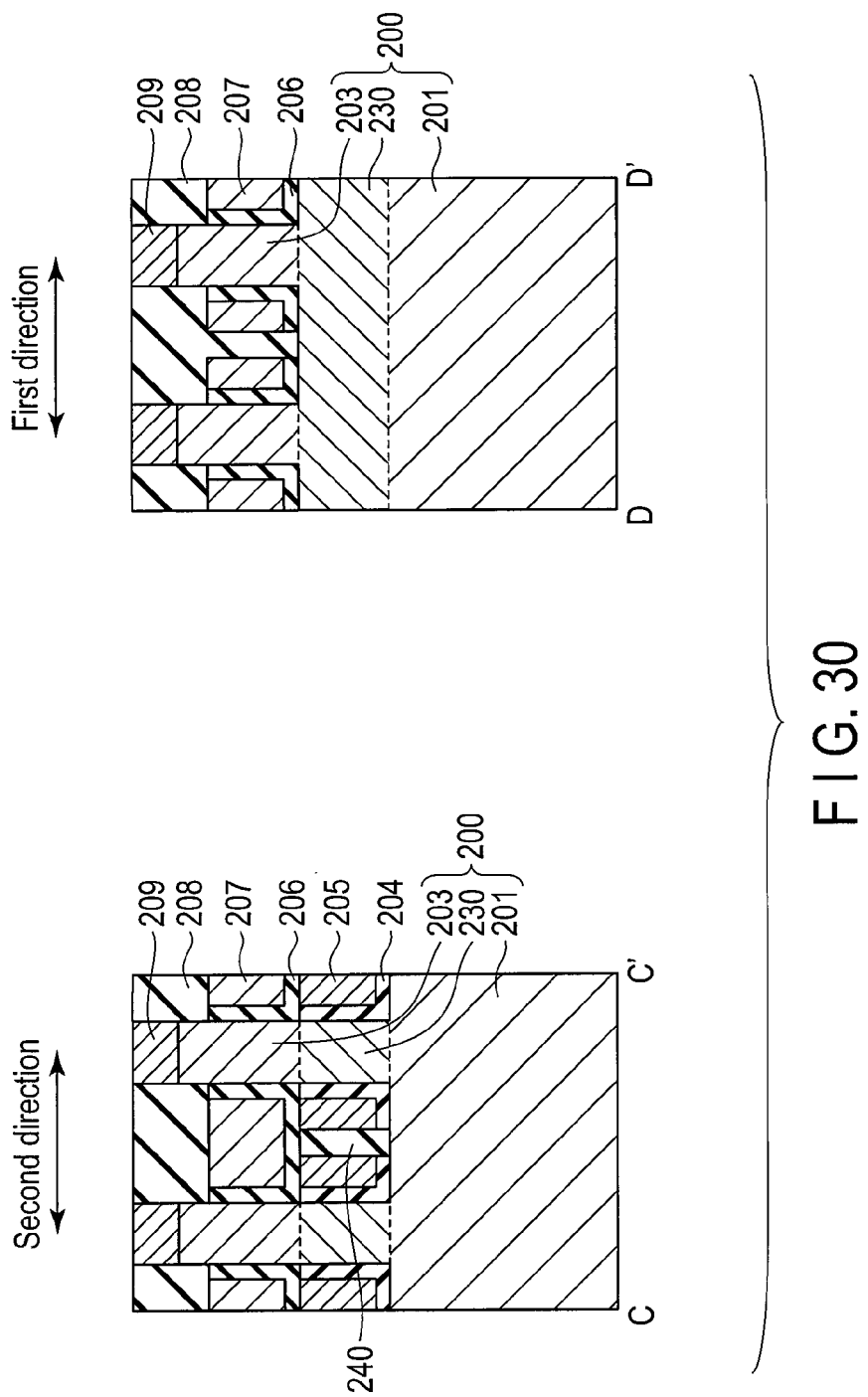
F I G. 30

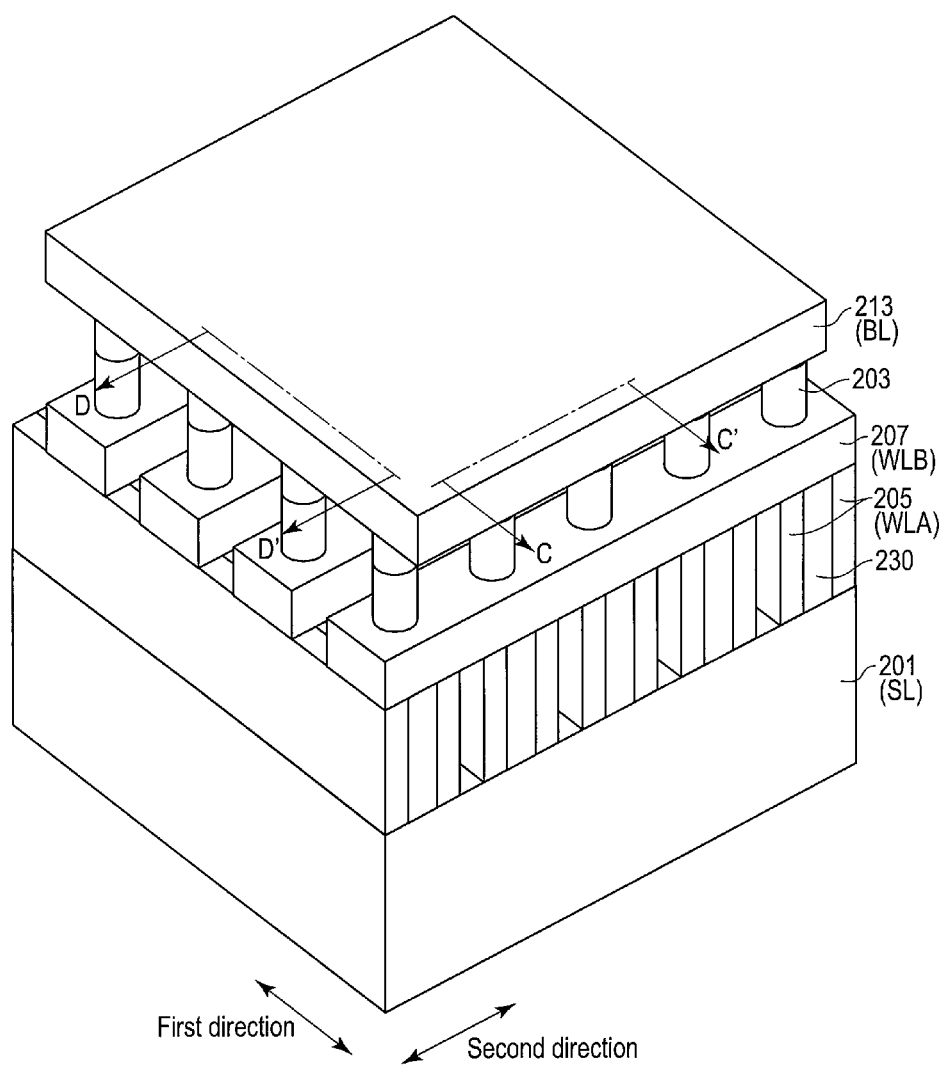
F I G. 34

US 9,190,452 B2

SEMICONDUCTOR MEMORY DEVICE

CROSS-REFERENCE TO RELATED APPLICATIONS

This application claims the benefit of U.S. Provisional Application No. 61/816,134, filed Apr. 25, 2013, the entire contents of which are incorporated herein by reference.

FIELD

Embodiments described herein relate generally to a semiconductor memory device.

BACKGROUND

A spin-transfer torque MRAM (Magnetic Random Access Memory) including a magnetoresistive element containing a ferromagnetic material as a memory element has been proposed. This MRAM is a memory that stores data by controlling the electrical resistance of the magnetoresistive element to two states, i.e., a high-resistance state and low-resistance state by changing the magnetization direction in a magnetic layer by using a current to be supplied to the magnetoresistive element.

In the MRAM, a memory cell is formed between a bit line and source line. The memory cell includes a selection transistor, and a magnetoresistive element connected in series with this selection transistor. To increase the degree of integration and the degree of micropatterning of memory cells like this, it is necessary to set the area of the memory cell at $4F^2$ as a feature size (minimum processing dimensions).

BRIEF DESCRIPTION OF THE DRAWINGS

FIG. 1 is a perspective view showing the arrangement of an MRAM according to a comparative example;

FIG. 2 is a perspective view showing the arrangement of an MRAM according to the first embodiment;

FIG. 5 is a circuit diagram showing the arrangement of the MRAM according to the first embodiment;

FIGS. 6, 8, 10, and 12 are perspective views showing the manufacturing steps of the MRAM according to the first embodiment;

FIG. 17 is a perspective view showing the fourth modification of the MRAM according to the first embodiment;

FIG. 19 is a perspective view showing the arrangement of an MRAM according to the second embodiment;

FIGS. 21, 23, 25, 27, and 29 are perspective views showing the manufacturing steps of the MRAM according to the second embodiment;

FIGS. 22, 24, 26, 28, and 30 include sectional views taken along lines C-C' and D-D' in FIGS. 21, 23, 25, 27, and 29, respectively;

FIG. 34 is a perspective view showing the fourth modification of the MRAM according to the second embodiment.

DETAILED DESCRIPTION

Figure 3:
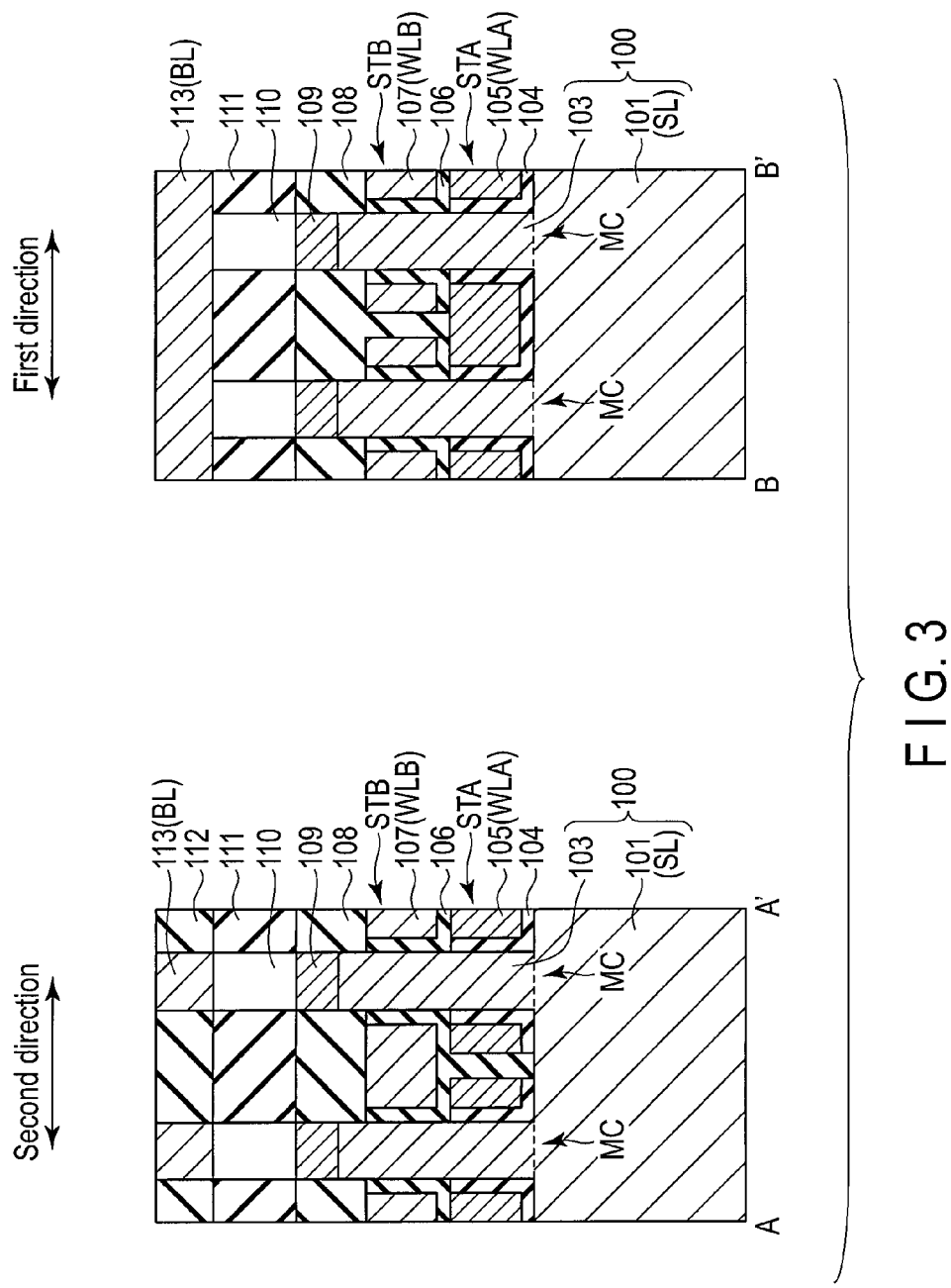
FIG. 3 includes sectional views taken along lines A-A' and B-B' in FIG. 2.

A DRAM (Dynamic Random Access Memory) in which the area of a memory cell is $4F^2$ has been proposed. In this DRAM, a lower interconnection, a vertical transistor using a semiconductor pillar, and a capacitor are formed in this order on a semiconductor substrate. The lower interconnection is a semiconductor interconnection integrated with the semiconductor substrate. When using the semiconductor interconnection, the parasitic resistance rises, and this makes a high-speed operation difficult in a large-area cell array. Also, the semiconductor interconnection is unsuitable for an MRAM requiring a large current.

To implement an MRAM having a memory cell area of $4F^2$, therefore, an interconnection having a low parasitic resistance, e.g., a metal interconnection must be formed as the lower interconnection.

FIG. 1 is a perspective view showing the arrangement of an MRAM according to a comparative example. More specifically, FIG. 1 shows an arrangement for implementing an MRAM having a memory cell area of $4F^2$.

As shown in FIG. 1, this MRAM according to the comparative example has an arrangement in which metal interconnections 301 are formed as lower interconnections (source lines SL) on a semiconductor substrate (not shown). Selection transistors each having a vertical transistor structure including a semiconductor pillar 303 and gate electrode 305 (word line WL) are formed on the interconnections 301. Magnetoresistive elements 310 are formed on the selection transistors, and interconnections 313 (bit lines BL) are formed on the magnetoresistive elements 310.

In this structure according to the comparative example, however, an Si layer for forming the semiconductor pillars 303 must be formed on the metal interconnections 301. This Si layer must be a single-crystal layer in an MRAM requiring a large current. However, no Si single crystal can be formed when an Si layer is simply formed on a metal layer. Forming an Si single crystal on a metal layer requires a technique of bonding two semiconductor substrates with a metal layer being sandwiched between them, and this increases the cost.

By contrast, this embodiment uses a plane semiconductor layer as the lower interconnection. In addition, a memory cell includes a magnetoresistive element and two selection transistors as vertical transistors. This makes it possible to solve the abovementioned problem, and implement an MRAM having a memory cell area of 4F².

In general, according to one embodiment, a semiconductor memory device comprises a semiconductor substrate including a plane portion expanding in a first direction and a second direction perpendicular to the first direction, and a pillar portion formed on an upper surface of the plane portion and extending in a stacking direction; a first gate electrode formed on a first gate insulating layer on a lower side surface of the pillar portion, and extending in the first direction; a second gate electrode formed on a second gate insulating layer on an upper side surface of the pillar portion, and extending in the second direction; a variable-resistance element formed on an upper surface of the pillar portion; and an interconnection formed on an upper surface of the variable-resistance element.

This embodiment will be explained below with reference to the accompanying drawings. In these drawings, the same reference numerals denote the same parts. Also, a repetitive explanation will be made as needed.

First Embodiment

An MRAM according to the first embodiment will be explained below with reference to FIGS. 2, 3, 4, 5, 6, 7, 8, 9, 10, 11, 12, 13, 14, 15, 16, 17, and 18. In the first embodiment, a source line SL is formed by a plane portion 101 of a semiconductor substrate 100, and two selection transistors STA and STB as vertical transistors each including a pillar portion 103 of the semiconductor substrate 100 as a channel are formed on the plane portion 101. A magnetoresistive element 110 is formed on the selection transistor STB, and a bit line BL (interconnection 113) is formed on the magnetoresistive element 110. This makes it possible to implement an MRAM having a memory cell area of 4F². The first embodiment will be explained in detail below.

Arrangement of First Embodiment

The arrangement of the MRAM according to the first embodiment will be explained below with reference to FIGS. 2, 3, 4, and 5.

FIG. 2 is a perspective view showing the arrangement of the MRAM according to the first embodiment. FIG. 3 includes sectional views taken along a line A-A' (a second direction) and a line B-B' (a first direction) in FIG. 2. Note that interlayer dielectric layers (to be described later) are not illustrated in FIG. 2.

As shown in FIGS. 2 and 3, the MRAM according to the first embodiment includes a semiconductor substrate 100, first gate electrodes 105, second gate electrodes 107, magnetoresistive elements 110 as variable-resistance elements, and interconnections 113 as bit lines BL. Thus, a plurality of memory cells MC arranged in a matrix are formed on the semiconductor substrate 100.

The semiconductor substrate 100 is, e.g., an Si substrate. The semiconductor substrate 100 includes a plane portion 101 expanding in the first direction and the second direction perpendicular to the first direction, and a plurality of pillar portions 103 extending in a stacking direction (a direction perpendicular to the first and second directions) on the upper surface of the plane portion 101. The plurality of pillar portions 103 are arranged in a matrix in the first and second directions. In other words, the plurality of pillar portions 103 are separated in the first and second directions.

The plane portion 101 has a source region (not shown), and functions as a source line SL. The pillar portion 103 has source/drain regions (not shown), and functions as a channel of selection transistors STA and STB (to be described later). An impurity such as P is doped in the source/drain regions of the pillar portion 103 when the selection transistors STA and STB are nMOS transistors, and an impurity such as B is doped in the source/drain regions of the pillar portion 103 when they are pMOS transistors. The planar shape of the pillar portion 103 is, e.g., a circle, but is not limited to this, and may also be a square, rectangle, or ellipse. The planar size (e.g., the diameter) of the pillar portion 103 is, e.g., equal to or smaller than a feature size F of lithography.

The first gate electrode 105 (a word line WLA) is formed on a first gate insulating layer 104 on the side surface of the pillar portion 103 above the plane portion 101. The first gate electrode 105 is so formed as to cover the lower side surface (circumference) of the pillar portion 103. Also, the first gate electrode 105 continues in the first direction, and is separated in the second direction. Accordingly, the first gate electrode 105 covers the side surfaces of a plurality of pillar portions 103 arranged in the first direction. In other words, a plurality of first gate electrodes 105 are arranged to form lines and spaces in the second direction.

Also, the first gate insulating layer 104 is continuously formed from the side surface of the pillar portion 103 to the upper surface of the plane portion 101. That is, the first gate electrode 105 is formed on the first gate insulating layer 104 on the upper surface of the plane portion 101. In other words, the first gate insulating layer 104 is formed between the first gate electrode 105 and pillar portion 103, and between the first gate electrode 105 and plane portion 101.

Thus, the lower portion of the pillar portion 103, the first gate insulating layer 104, and the first gate electrode 105 form a selection transistor STA as a vertical transistor.

The second gate electrode 107 (a word line WLB) is formed on a second gate insulating layer 106 on the side surface of the pillar portion 103 above the first gate electrode 105. The second gate electrode 107 is so formed as to cover the upper side surface (circumference) of the pillar portion 103. Therefore, the second gate electrode 107 covers the side surfaces of a plurality of pillar portions 103 arranged in the second direction. Also, the second gate electrode 107 continues in the second direction, and is separated in the first direction. In other words, a plurality of second gate electrodes 107 are arranged to form lines and spaces in the first direction.

The second gate insulating layer 106 is continuously formed from the side surface of the pillar portion 103 to the upper surface of the first gate electrode 105. That is, the second gate electrode 107 is formed on the second gate insulating layer 106 on the upper surface of the first gate electrode 105. In other words, the second gate insulating layer 106 is formed between the second gate electrode 107 and pillar portion 103, and between the second gate electrode 107 and first gate electrode 105.

Figure 11:
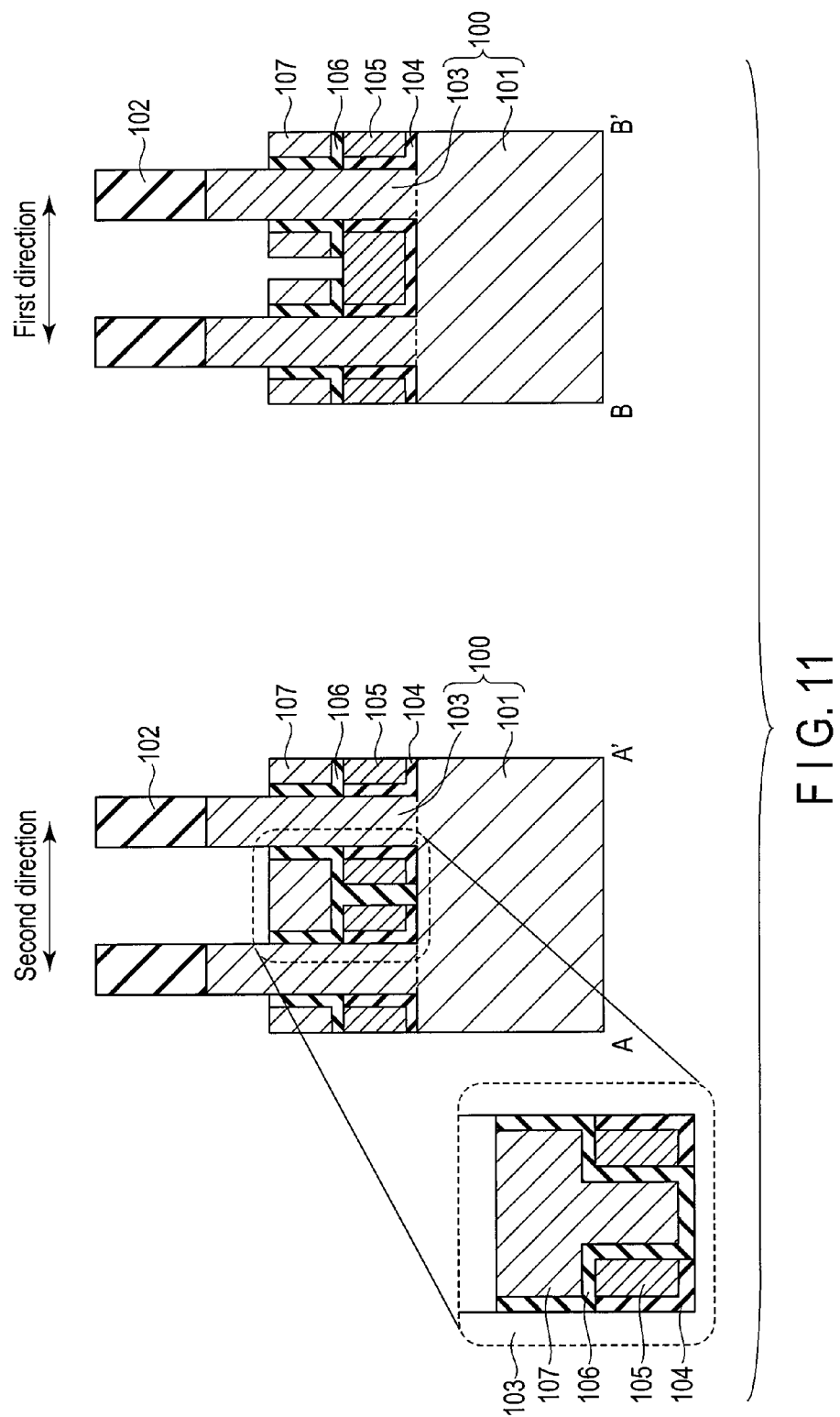

Furthermore, the second gate insulating layer 106 is continuously formed from the upper surface to the side surfaces of the first gate electrode 105. The second gate insulating layer 106 may or may not be buried between two first gate electrodes 105 adjacent to each other in the second direction. When the second gate insulating layer 106 is not buried, the second gate electrode 107 can be buried between two first gate electrodes 105 adjacent to each other in the second direction in a process to be described later as shown in FIG. 11.

Thus, the upper portion of the pillar portion 103, the second gate insulating layer 106, and the second gate electrode 107 form a selection transistor STB as a vertical transistor.

The upper surfaces of the second gate insulating layer 106 and second gate electrode 107 are lower than the upper surface of the pillar portion 103. Accordingly, the pillar portion 103 projects from the second gate insulating layer 106 and second gate electrode 107. A silicide layer 109 is formed on the uppermost portion of the projecting pillar portion 103. An interlayer dielectric layer 108 made of, e.g., SiO$_2$ is buried between the pillar portions 103 (silicide layers 109) adjacent to each other in the first and second directions, and between the second gate electrodes 107 adjacent to each other in the first direction.

The magnetoresistive element 110 is formed on the upper surface of the pillar portion 103 (silicide layer 109), and electrically connected to the pillar portion 103. The magnetoresistive element 110 stores data in accordance with its magnetized state.

Figure 4A:
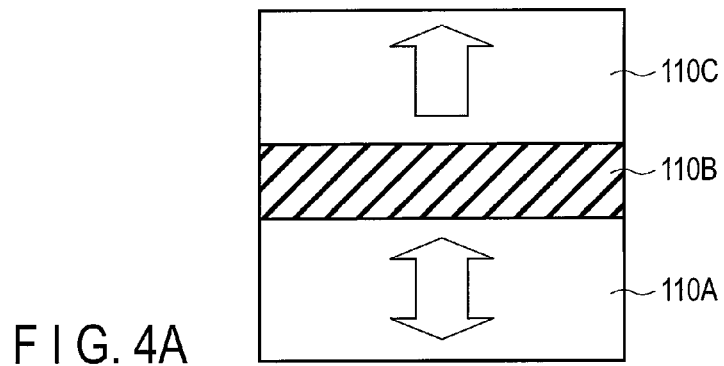
FIG. 4A is a sectional view showing the structure of a magnetoresistive element.

FIG. 4A is a sectional view showing the structure of the magnetoresistive element 110. FIG. 4A mainly shows a storage layer 110A, tunnel barrier layer 110B, and reference layer 110C as the magnetoresistive element 110.

As shown in FIG. 4A, the magnetoresistive element 110 includes the storage layer 110A as a ferromagnetic layer, the reference layer 110C as a ferromagnetic layer, and the tunnel barrier layer 110B as a nonmagnetic layer formed between them.

The storage layer 110A is a ferromagnetic layer which is made of, e.g., CoFeB and in which the magnetization direction is variable. The storage layer 110A has perpendicular magnetic anisotropy perpendicular to or almost perpendicular to the film planes (the upper surface/lower surface). "The magnetization direction is variable" herein mentioned indicates that the magnetization direction varies with respect to a predetermined write current. Also, "almost perpendicular" means that the direction of residual magnetization falls within the range of $45°<\theta\leq90°$ with respect to the film planes.

The tunnel barrier layer 110B is formed on the storage layer 110A. The tunnel barrier layer 110B is a nonmagnetic layer and made of, e.g., MgO.

The reference layer 110C is formed on the tunnel barrier layer 110B. The reference layer 110C is a ferromagnetic layer which is made of, e.g., CoFeB and in which the magnetization direction is invariable. The reference layer 110C has perpendicular magnetic anisotropy perpendicular to or almost perpendicular to the film planes. "The magnetization direction is invariable" herein mentioned indicates that the magnetization direction does not vary with respect to a predetermined write current. That is, the magnetization direction switching energy barrier in the reference layer 110C is larger than that in the storage layer 110A.

Note that the storage layer 110A and reference layer 110C may have in-plane magnetic anisotropy instead of perpendicular magnetic anisotropy.

Figure 4B:
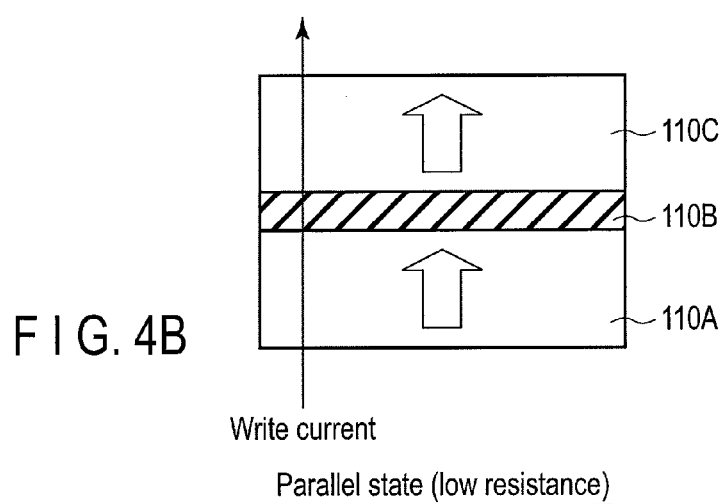
FIG. 4B is a view for explaining a write operation of the magnetoresistive element, i.e., a sectional view of the magnetoresistive element in a parallel state.
Figure 4C:
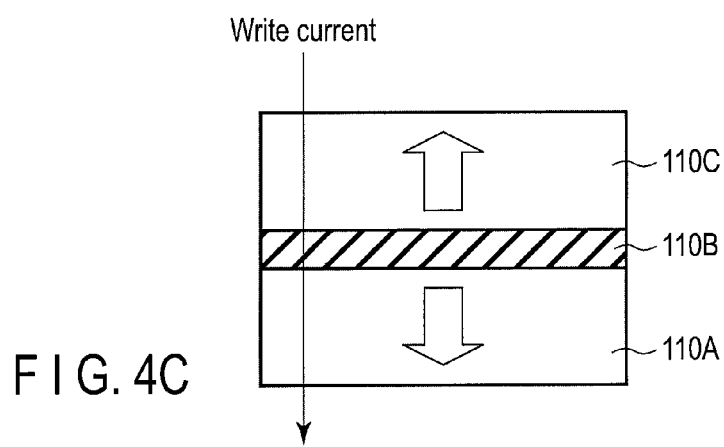
FIG. 4C is a view for explaining a write operation of the magnetoresistive element, i.e., a sectional view of the magnetoresistive element in an antiparallel state.

FIG. 4B is a view for explaining a write operation of the magnetoresistive element 110, i.e., a sectional view of the magnetoresistive element 110 in a parallel state. FIG. 4C is a view for explaining a write operation of the magnetoresistive element 110, i.e., a sectional view of the magnetoresistive element 110 in an antiparallel state.

The magnetoresistive element 110 is, e.g., a spin-transfer torque magnetoresistive element. Accordingly, when writing data to or reading data from the magnetoresistive element 110, currents are bidirectionally supplied to the magnetoresistive element 110 in the direction perpendicular to the film planes.

More specifically, data is written to the magnetoresistive element 110 as follows.

As shown in FIG. 4B, when an current flows from the storage layer 110A to the reference layer 110C, i.e., when electrons are supplied from the reference layer 110C to the storage layer 110A, electrons spin-polarized in the same direction as the magnetization direction in the reference layer 110C are transferred into the storage layer 110A. In this case, the magnetization direction in the storage layer 110A is matched with that in the reference layer 110C. Consequently, the magnetization directions in the reference layer 110C and storage layer 110A are arranged parallel to each other. In this parallel state, the resistance value of the magnetoresistive element 110 is smallest. This state is defined as, e.g., data "0".

On the other hand, as shown in FIG. 4C, when an current flows from the reference layer 110C to the storage layer 110A, i.e., when electrons are supplied from the storage layer 110A to the reference layer 110C, electrons spin-polarized in the direction opposite to the magnetization direction in the reference layer 110C as they are reflected by the reference layer 110C are transferred into the storage layer 110A. In this case, the magnetization direction in the storage layer 110A is matched with the direction opposite to the magnetization direction in the reference layer 110C. Consequently, the magnetization directions in the reference layer 110C and storage layer 110A are arranged antiparallel to each other. In this antiparallel state, the resistance value of the magnetoresistive element 110 is largest. This state is defined as, e.g., data "1".

Also, data is read from the magnetoresistive element 110 as follows.

A read current is supplied to the magnetoresistive element 110. This read current is set at a value at which the magnetization direction in the storage layer 110A does not reverse (i.e., a value smaller than that of the write current). Data "0" or "1" described above can be read by detecting the change in resistance value of the magnetoresistive element 110 when the read current is supplied.

An interlayer dielectric layer 111 made of, e.g., SiO$_2$ is buried between the magnetoresistive elements 110 adjacent to each other in the first and second directions.

An interlayer dielectric layer 112 made of, e.g., SiO$_2$ is formed on the magnetoresistive elements 110 and interlayer dielectric layer 111. In the interlayer dielectric layer 112, interconnections 113 functioning as the bit lines BL are formed in contact with the magnetoresistive elements 110. The bit lines BL continue in the direction, and are separated in the second direction. In other words, the plurality of bit lines BL are arranged to form lines and spaces in the second direction. Also, although not shown, the end portions of the plurality of bit lines BL are electrically connected to each other. That is, all the memory cells MC are electrically connected to the bit lines BL.

FIG. 5 is a circuit diagram showing the arrangement of the MRAM according to the first embodiment.

As shown in FIG. 5, the MRAM according to the first embodiment includes a plurality of memory cells MC1-1 to MC3-3 arranged in a matrix.

Each of the memory cells MC1-1 to MC3-3 has a series circuit of the selection transistors STA and STB and magnetoresistive element 110. The magnetoresistive element 110 has one terminal electrically connected to the bit line BL, and the other terminal electrically connected to one terminal of the selection transistor STB. The other terminal of the selection transistor STB is electrically connected to one terminal of the selection transistor STA. The other terminal of the selection transistor STA is electrically connected to the source line SL. The bit line BL and source line SL are electrically connected to all the memory cells MC1-1 to MC3-3.

The gates of the selection transistors STA in the memory cells MC1-1, MC1-2, and MC1-3 are electrically connected together to a word line WLA1, the gates of the selection transistors STA in the memory cells MC2-1, MC2-2, and MC2-3 are electrically connected together to a word line WLA2, and the gates of the selection transistors STA in the memory cells MC3-1, MC3-2, and MC3-3 are electrically connected together to a word line WLA3. Also, the gates of the selection transistors STB in the memory cells MC1-1, MC2-1, and MC3-1 are electrically connected together to a word line WLB1, the gates of the selection transistors STB in the memory cells MC1-2, MC2-2, and MC3-2 are electrically connected together to a word line WLB2, and the gates of the selection transistors STB in the memory cells MC1-3, MC2-3, and MC3-3 are electrically connected together to a word line WLB3.

A method of selecting the memory cell MC in various operations (a write operation and read operation) of the MRAM will be explained below. In this embodiment, a method of selecting the memory cell MC1-1 will be explained as an example.

When selecting the memory cell MC1-1 as a target of the various operations, a power supply voltage VDD, for example, is applied to the word line WLA1, thereby turning on the selection transistor STA of the memory cell MC1-1. Also, the power supply voltage VDD, for example, is applied to the word line WLB1, thereby turning on the selection transistor STB of the memory cell MC1-1. In this state, a potential difference is produced between the bit line BL and source line SL. This makes it possible to supply a current to the memory cell MC1-1, and selectively perform the various operations on the memory cell MC1-1.

On the other hand, a ground voltage VSS, for example, is applied to the word lines WLA2 and WLA3, thereby turning off the selection transistors STA of the memory cells MC2-1, MC3-1, MC2-2, MC3-2, MC2-3, and MC3-3. Also, the ground voltage VSS, for example, is applied to the word lines WLB2 and WLB3, thereby turning off the selection transistors STB of the memory cells MC1-2, MC2-2, MC3-2, MC1-3, MC2-3, and MC3-3. That is, no current flows through the memory cells MC except for the memory cell MC1-1 because the selection transistors STA or/and selection transistors STB are turned off.

As described above, the various operations can be performed by selecting the memory cell MC1-1 even in a cell array in which the bit lines BL and source line SL are electrically connected to all the memory cells MC.

Manufacturing Method of First Embodiment

A method of manufacturing the MRAM according to the first embodiment will be explained below with reference to FIGS. 6, 7, 8, 9, 10, 11, 12, and 13.

FIGS. 6, 8, 10, and 12 are perspective views showing the manufacturing steps of the MRAM according to the first embodiment. FIGS. 7, 9, 11, and 13 include sectional views taken along a line A-A' (the second direction) and a line B-B' (the first direction) in FIGS. 6, 8, 10, and 12, respectively. Note that interlayer dielectric layers are not illustrated in FIGS. 6, 8, 10, and 12.

Figure 6:
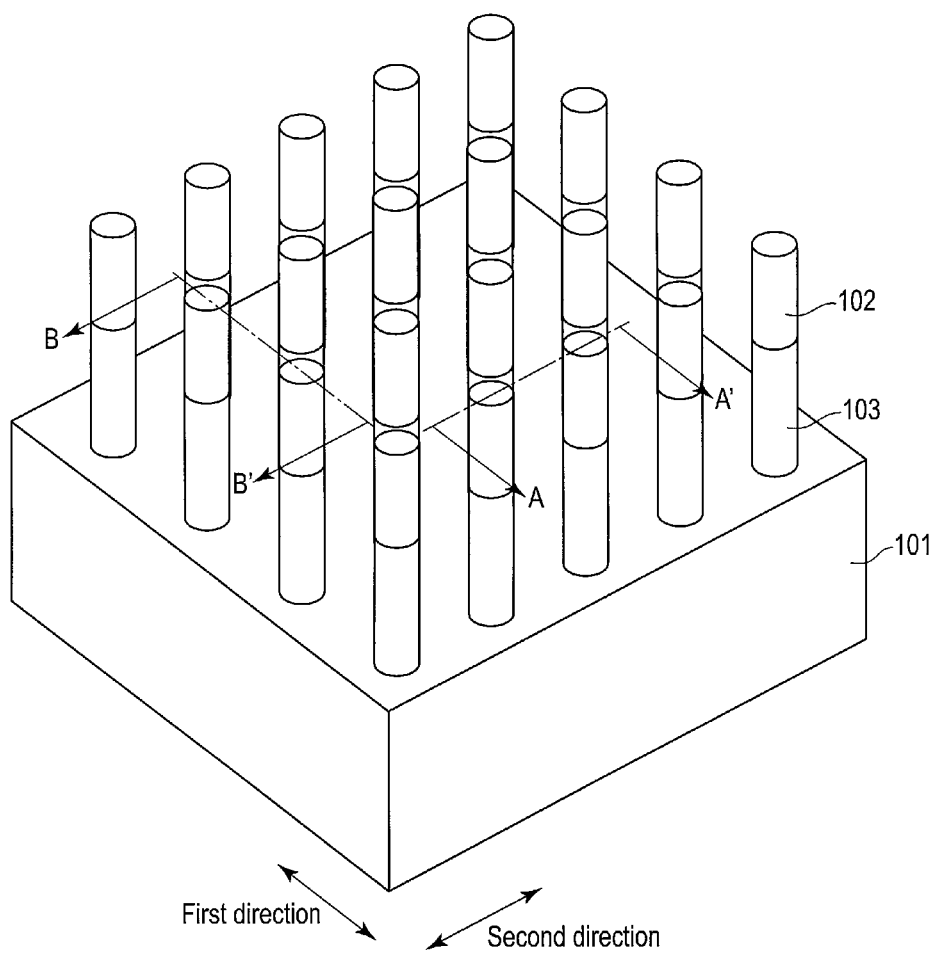
Figure 7:
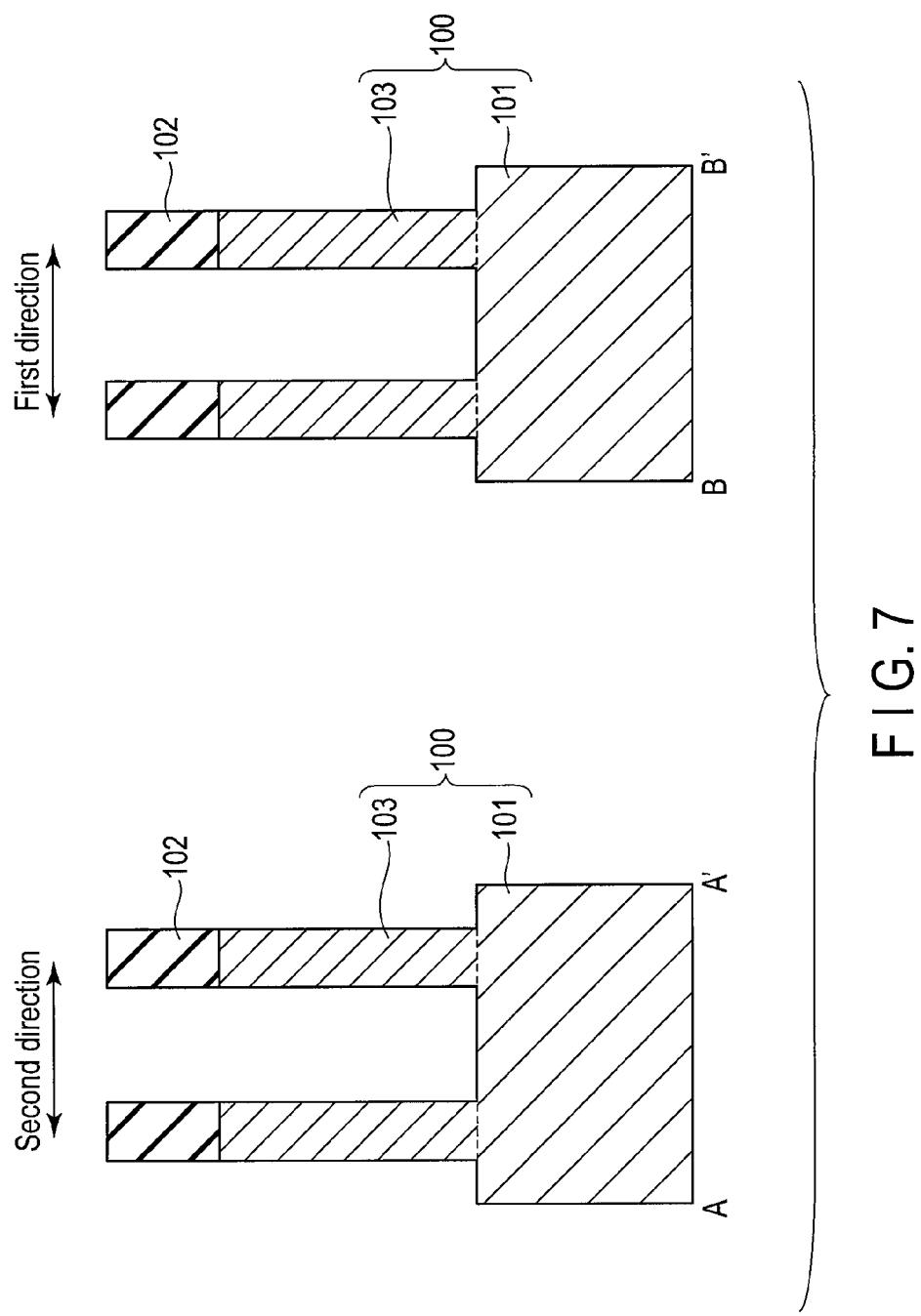
FIGS. 7, 9, 11, and 13 include sectional views taken along lines A-A' and B-B' in FIGS. 6, 8, 10, and 12, respectively.

First, as shown in FIGS. 6 and 7, impurity ions are implanted into a semiconductor substrate 100, thereby forming a well region (not shown). Then, impurity ions having a conductivity type different from that of the well region are implanted into the semiconductor substrate 100, thereby forming source/drain regions (not shown). An impurity such as P is doped in the source/drain regions of the pillar portion 103 when the selection transistors STA and STB are nMOS transistors, and an impurity such as B is doped in the source/drain regions of the pillar portion 103 when they are pMOS transistors. These source/drain regions function as source/drain regions of the selection transistor STB (to be described later), which are formed on the side of the magnetoresistive element 110.

Subsequently, a hard mask 102 made of, e.g., SiN is formed on the semiconductor substrate 100. After a resist (not shown) having a circular planar shape is formed on the hard mask 102, the hard mask 102 is patterned by RIE (Reactive Ion Etching) using the resist as a mask. The planar shape of the hard mask 102 is, e.g., a circle. Then, a portion of the semiconductor substrate 100 is processed by RIE using the resist and hard masks 102 as masks, thereby forming, in the semiconductor substrate 100, a plane portion 101 expanding in the first and second directions, and pillar portions 103 extending in the stacking direction on the plane portion 101. After that, the resist (not shown) is removed, and impurity ions are implanted into the upper surface of the plane portion 101, thereby forming source/drain regions (not shown). These source/drain regions function as source/drain regions of the selection transistor STA (to be described later), which are formed on the side of the plane portion 101.

Figure 8:
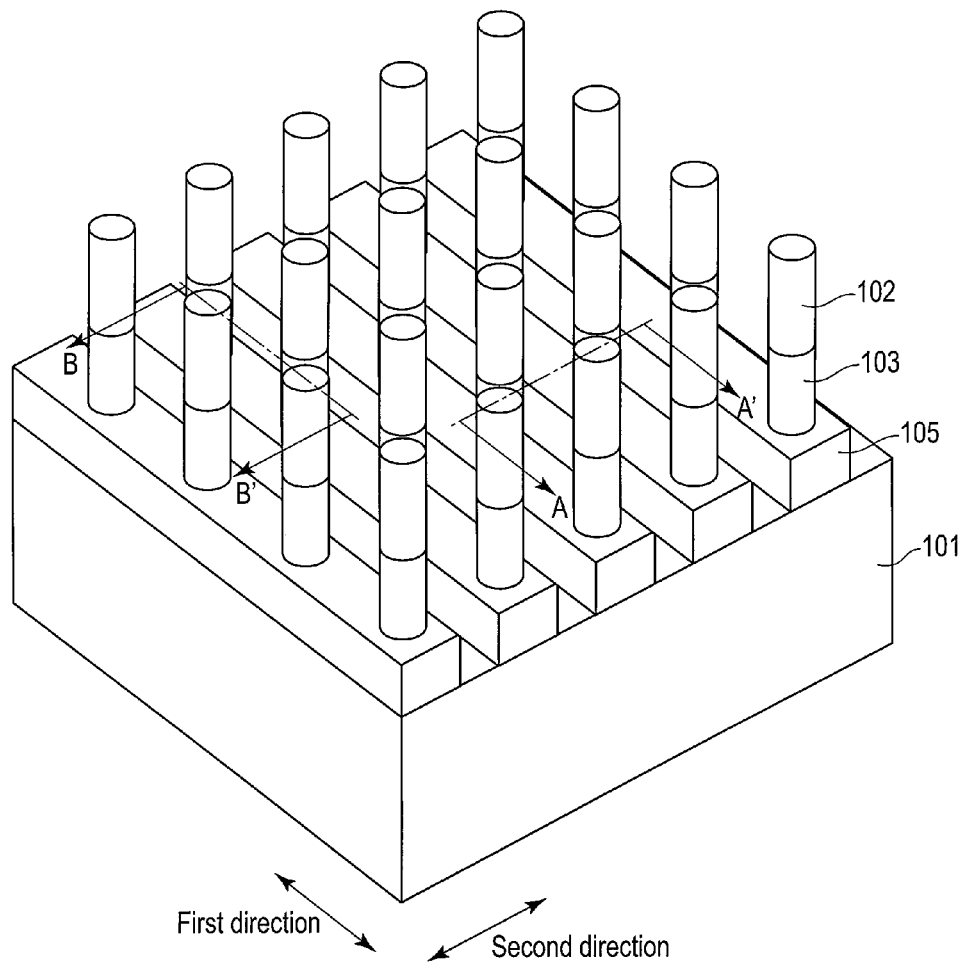
Figure 9:
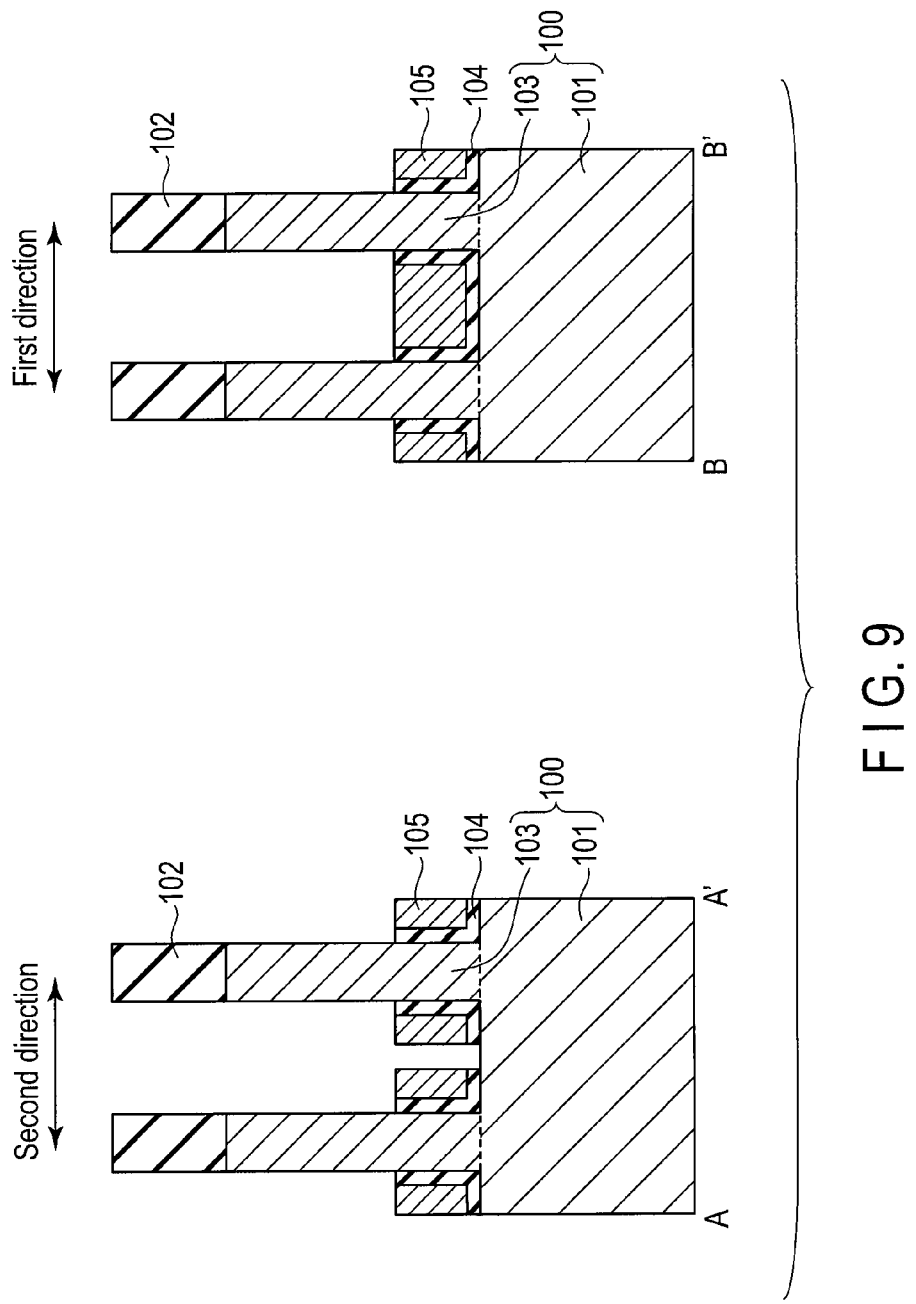

As shown in FIGS. 8 and 9, a first gate insulating layer 104 made of, e.g., an oxide film ($SiO_2$ film) is formed on the upper surface of the plane portion 101 and on the side surfaces of the pillar portions 103. A first gate electrode 105 made of, e.g., polysilicon or W is formed on the first gate insulating layer 104. The first gate electrode 105 is so formed as to cover the pillar portions 103 and hard masks 102, and to have the upper surface higher than the upper surfaces of the hard masks 102.

Then, the first gate electrode 105 is processed by CMP (Chemical Mechanical Polishing) so as to have the upper surface leveled with the upper surfaces of the hard masks 102. Subsequently, a resist (not shown) extending in the first direction is formed on the first gate electrode 105 and hard masks 102, and the first gate electrode 105 is processed by RIE using this resist as a mask. Consequently, the first gate electrode 105 continues in the first direction, and is separated in the second direction. After that, the resist is removed, and the upper portions of the first gate electrodes 105 are partially removed (etched back) by RIE so that the first gate electrodes 105 cover the lower side surfaces of the pillar portions 103. In this step, the first gate insulating layer 104 exposed by the removal of the first gate electrodes 105 is also removed.

Thus, the lower portion of the pillar portion 103, the first gate insulating layer 104, and the first gate electrode 105 form the selection transistor STA as a vertical transistor.

Then, impurity ions are implanted into a region from the upper surfaces of the first gate insulating layer 104 and first gate electrode 105 to the side surface of the pillar portion 103, thereby forming source/drain regions (not shown). These source/drain regions function as source/drain regions of the selection transistor STA, which are formed on the side of the magnetoresistive element 110, and as source/drain regions of the selection transistor STB (to be described later), which are formed on the side of the plane portion 101.

As shown in FIGS. 10 and 11, a second insulating layer 106 made of, e.g., an oxide film ($SiO_2$ film) is formed on the side surfaces of the pillar portions 103 by, e.g., thermal oxidation or CVD. The second gate insulating layer 106 is continuously formed from the side surface of the pillar portion 103 to the upper surface of the first gate electrode 105. The second gate insulating layer 106 is also continuously formed from the upper surface to the side surfaces of the first gate electrode 105. The second gate insulating layer 106 may or may not be buried between the first gate electrodes 105 adjacent to each other in the second direction. When the second gate insulating layer 106 is not buried, as indicated by a portion indicated by the broken lines in FIG. 11, a second gate electrode 107 (to be described below) may be buried between the first gate electrodes 105 adjacent to each other in the second direction.

Then, a second gate electrode 107 made of, e.g., polysilicon or W is formed on the second gate insulating layer 106. The second gate electrode 107 is so formed as to cover the pillar portions 103 and hard masks 102, and to have the upper surface higher than the upper surfaces of the hard masks 102.

Subsequently, the second gate electrode 107 is processed by CMP so as to have the upper surface leveled with the upper surfaces of the hard masks 102. A resist (not shown) extending in the second direction is formed on the second gate electrode 107 and hard masks 102, and the second gate electrode 107 is processed by RIE using this resist as a mask. Consequently, the second gate electrode 107 continues in the second direction, and is separated in the first direction. After that, the resist is removed, and the upper portions of the second gate electrodes 107 are partially removed by RIE so that the second gate electrodes 107 cover the upper side surfaces of the pillar portions 103. The upper surfaces of the second gate insulating layer 106 and second gate electrodes 107 are formed lower than the upper surfaces of the pillar portions 103. In this step, the second gate insulating layer 106 exposed by the removal of the second gate electrodes 107 is also removed. Then, impurity ions having a conductivity type different from that of the well region are implanted into the pillar portions 103, thereby forming source/drain regions (not shown). After that, the impurity ions are activated by an annealing process.

Figure 13:
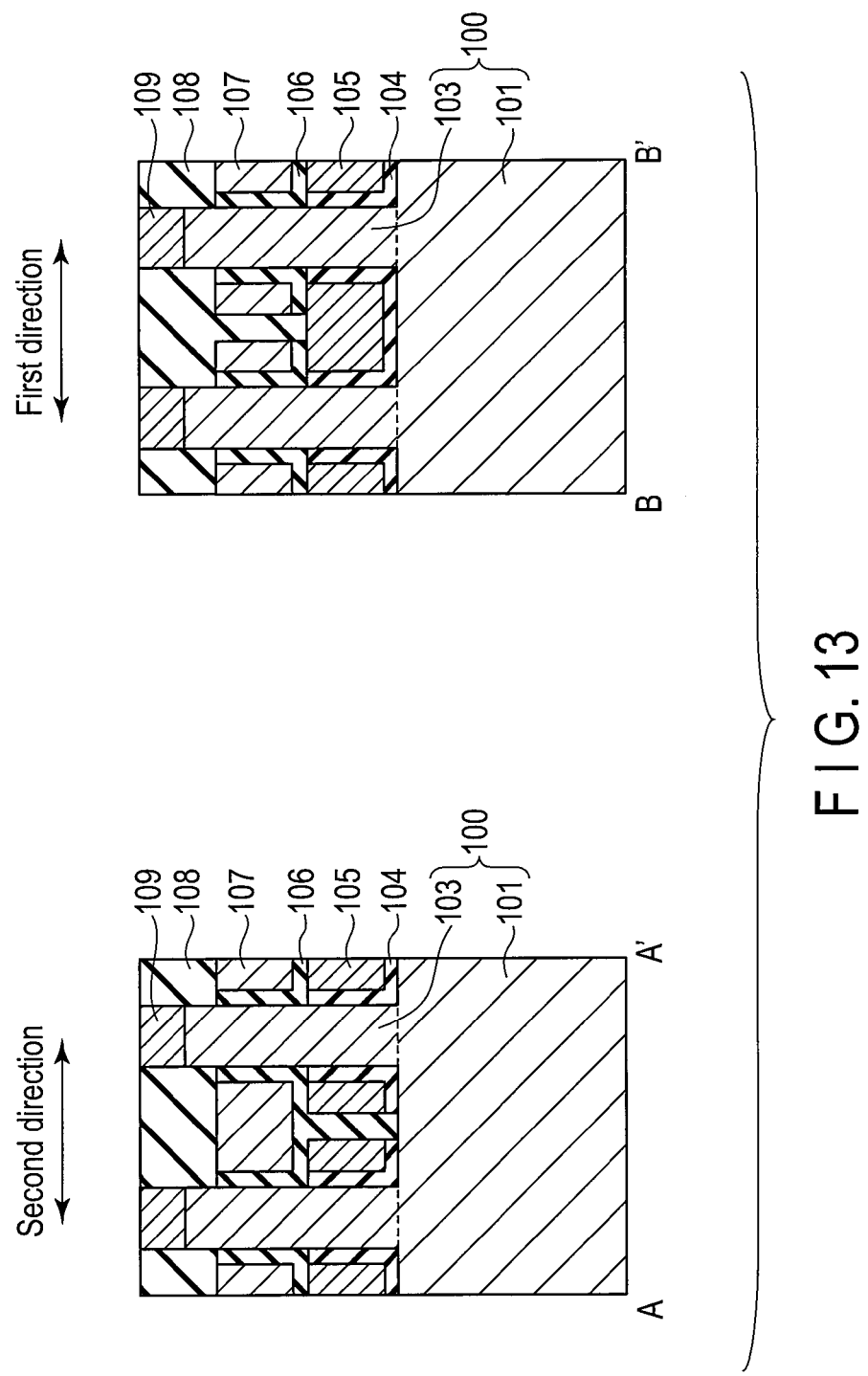

As shown in FIGS. 12 and 13, an interlayer dielectric layer 108 made of, e.g., $SiO_2$ is buried between the pillar portions 103 adjacent to each other in the first and second directions, and between the second gate electrodes 107 adjacent to each other in the first direction. The interlayer dielectric layer 108 is so formed as to cover the upper surfaces of the hard masks 102. The interlayer dielectric layer 108 is then processed by CMP so as to have the upper surface leveled with the upper surfaces of the hard masks 102. After that, the hard masks 102 are removed by RIE. In addition, the upper portion of the interlayer dielectric layer 108 is partially removed by RIE so that the interlayer dielectric layer 108 has the upper surface leveled with the upper surfaces of the pillar portion 103.

Then, a metal layer (Co, Ni, or Ti) (not shown) is formed on the upper surface of each pillar portion 103. After that, the pillar portion 103 and metal layer are annealed, thereby forming a silicide layer 109 on top of the pillar portion 103.

As shown in FIGS. 2 and 3, a magnetoresistive element 110 is formed on the upper surface of each pillar portion 103 (silicide layer 109). More specifically, a storage layer 110A, tunnel barrier layer 110B, and reference layer 110C are formed in this order on the pillar portion 103 and interlayer dielectric layer 108. The storage layer 110A and reference layer 110C are ferromagnetic layers made of, e.g., CoFeB, and the tunnel barrier layer 110B is a nonmagnetic layer made of, e.g., MgO.

Then, the storage layer 110A, tunnel barrier layer 110B, and reference layer 110C are processed by physical etching such as IBE (Ion Beam Etching) so as to be left behind on the upper surface of each pillar portion 103. After that, an interlayer dielectric layer 111 made of, e.g., $SiO_2$ is buried between the magnetoresistive elements 110 adjacent to each other in the first and second directions.

Subsequently, an interlayer dielectric layer 112 made of, e.g., $SiO_2$ is formed on the magnetoresistive elements 110 and interlayer dielectric layer 111. Trenches reaching the magnetoresistive elements 110 are formed in the interlayer dielectric layer 112. Interconnections 113 functioning as the bit lines BL are formed in these trenches. The bit lines BL continue in the first direction, and are separated in the second direction.

Thus, the MRAM according to the first embodiment is formed.

Effects of First Embodiment

In the abovementioned first embodiment, the source line SL is formed by the plane portion 101 of the semiconductor substrate 100, and the two selection transistors STA and STB as vertical transistors each including the pillar portion 103 of the semiconductor substrate 100 as a channel are formed on the plane portion 101. The magnetoresistive element 110 is formed on the selection transistor STB, and the bit line BL (interconnection 113) is formed on the magnetoresistive element 110.

Since the plane portion 101 of the semiconductor substrate 100 is used as the lower interconnection (source line SL), an interconnection having a sufficiently low resistance can be formed without using any metal interconnection. Also, the cost can be reduced because no semiconductor substrate bonding technique is necessary unlike in the comparative example. In addition, although the source line SL is connected to all the memory cells MC, one memory cell MC (one bit) can be selected because the two selection transistors STA and STB are formed. Thus, the structure disclosed in the first embodiment can implement an MRAM having a memory cell area of $4F^2$.

[Modifications]

Modifications of the MRAM according to the first embodiment will be explained below with reference to FIGS. 14, 15, 16, 17, and 18.

Figure 14:
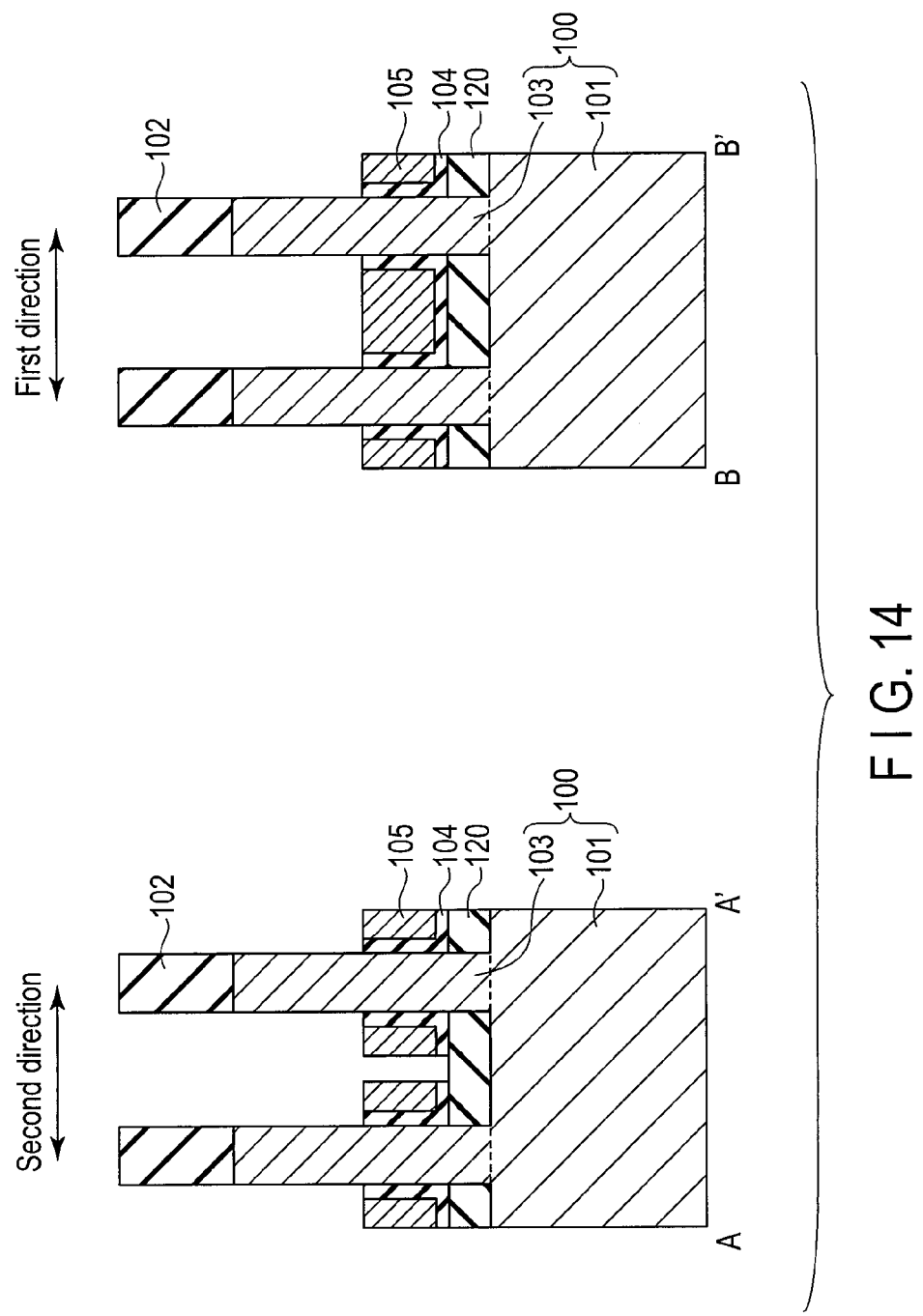
FIG. 14 is a sectional view showing the first modification of the MRAM according to the first embodiment.
Figure 15:
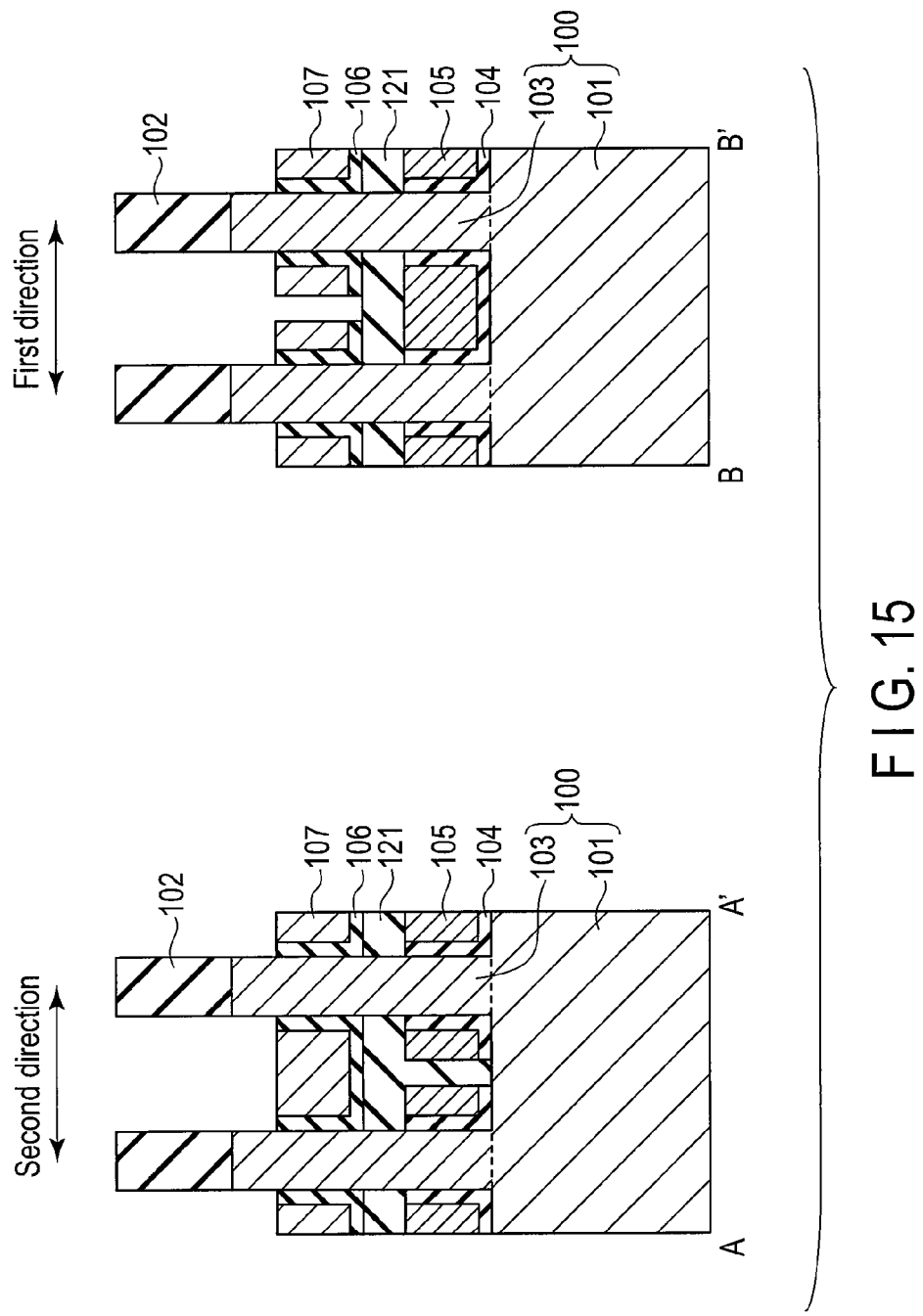
FIG. 15 is a sectional view showing the second modification of the MRAM according to the first embodiment.
Figure 16:
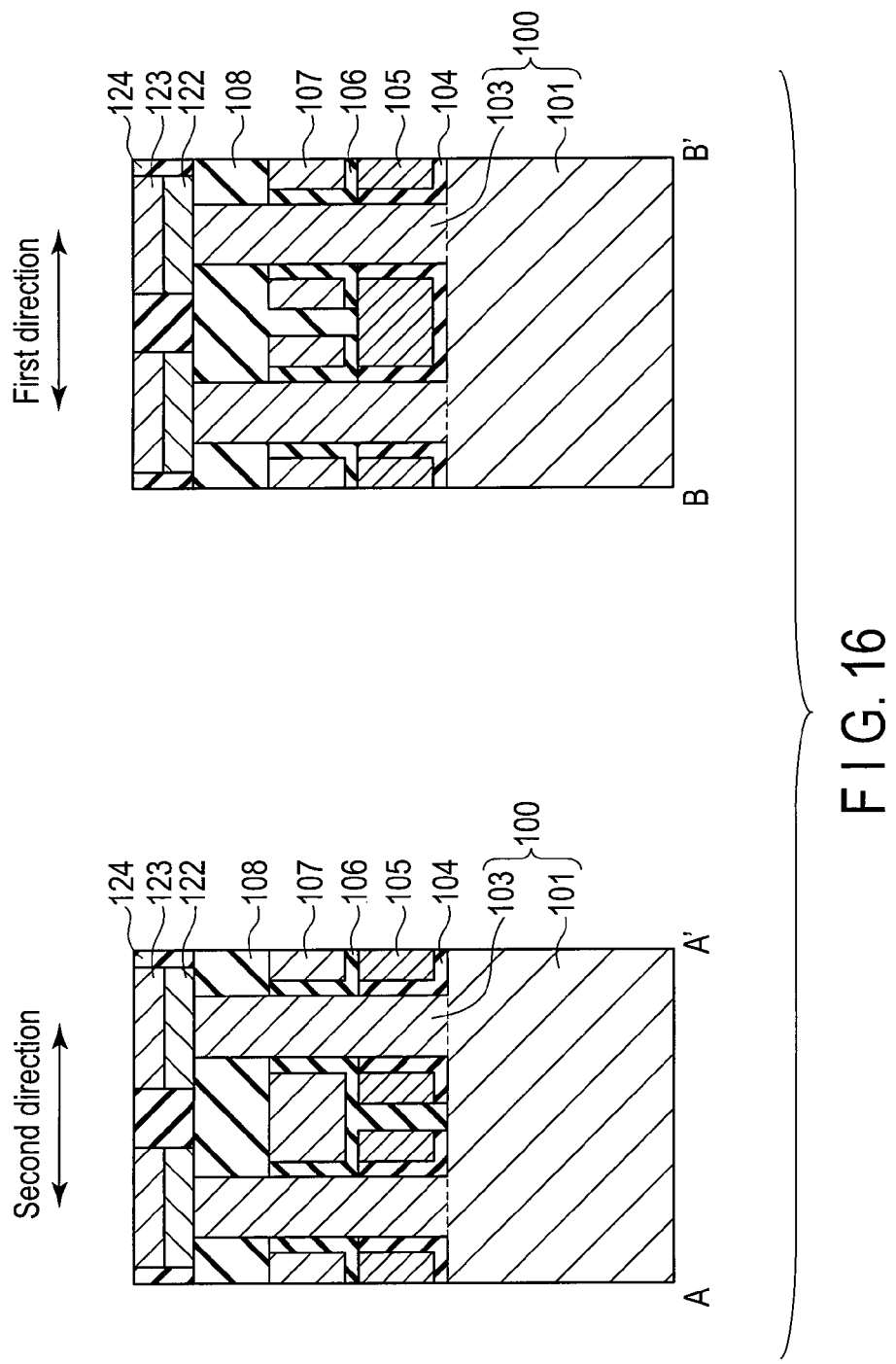
FIG. 16 is a sectional view showing the third modification of the MRAM according to the first embodiment.
Figure 18:
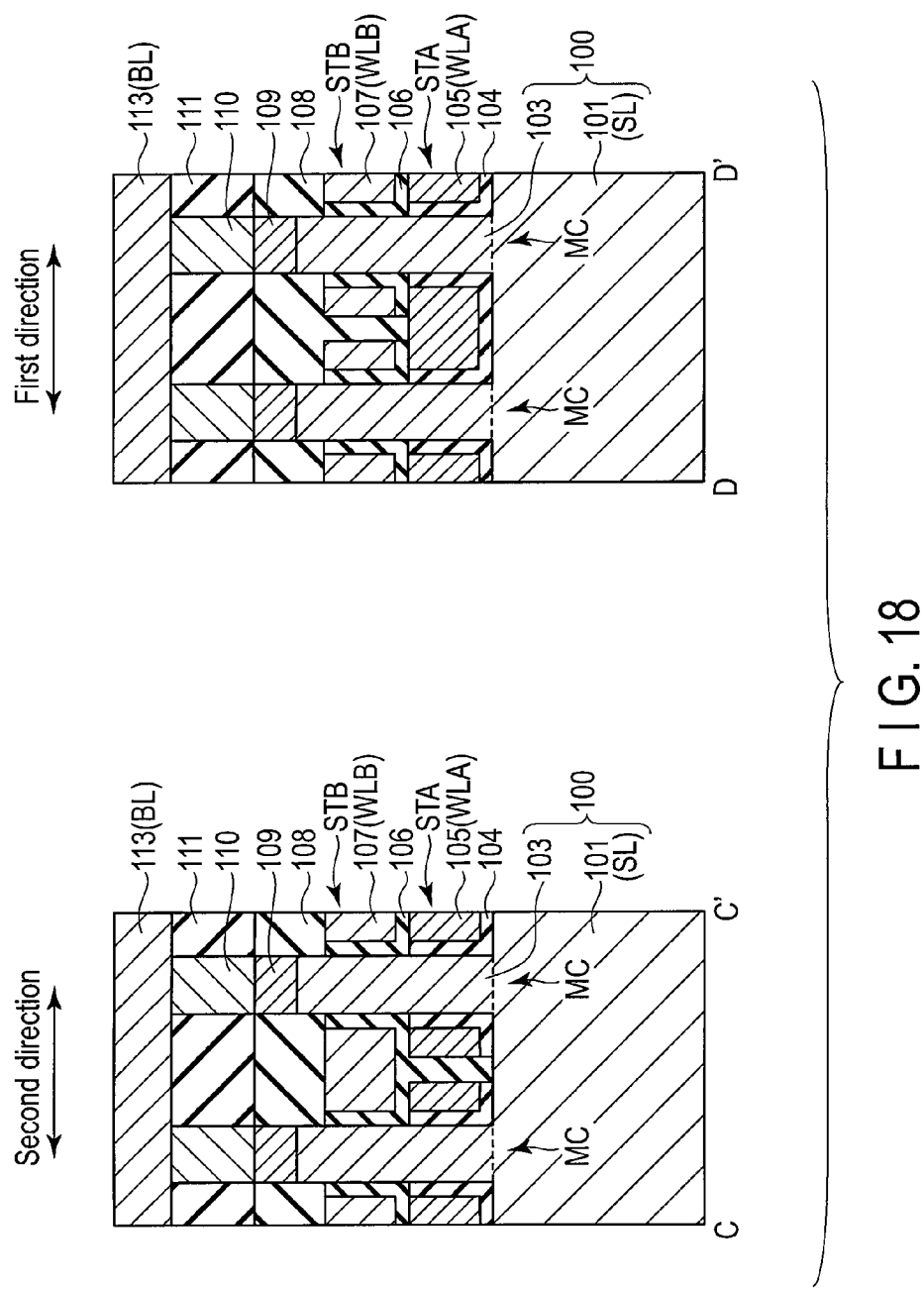
FIG. 18 includes sectional views taken along lines A-A' and B-B' in FIG. 17.

FIG. 14 is a sectional view showing the first modification of the MRAM according to the first embodiment. FIG. 15 is a sectional view showing the second modification of the MRAM according to the first embodiment. FIG. 16 is a sectional view showing the third modification of the MRAM according to the first embodiment. FIG. 17 is a perspective view showing the fourth modification of the MRAM according to the first embodiment. FIG. 18 includes sectional views taken along lines A-A' and B-B' in FIG. 17.

In the first modification as shown in FIG. 14, an insulating layer 120 made of, e.g., $SiO_2$ is formed on the upper surface of the plane portion 101. In other words, the insulating layer 120 is formed between the first gate insulating layer 104 and plane portion 101. By thus forming not only the first gate insulating layer 104 but also the insulating layer 120 between the first gate electrode 105 and plane portion 101, the parasitic capacitance between the first gate electrode 105 and plane portion 101 can be reduced.

The insulating layer 120 is formed after the plane portion 101 is formed and the pillar portions 103 are formed on the plane portion 101 in the step shown in FIGS. 6 and 7, and before the first gate insulating layer 104 is formed in the step shown in FIGS. 8 and 9.

More specifically, after the step shown in FIGS. 6 and 7, the insulating layer 120 is so formed as to cover the pillar portions 103 and hard masks 102, and to have the upper surface higher than the upper surfaces of the hard masks 102. After that, the insulating layer 120 is processed by CMP so as to have the upper surface leveled with the upper surfaces of the hard masks 102. Then, the insulating layer 120 is processed (etched back) by RIE or wet etching so as to cover the lower side surfaces of the pillar portions 103. After that, the step shown in FIGS. 8 and 9 is performed.

In the second modification as shown in FIG. 15, an insulating layer 121 made of, e.g., $SiO_2$ is formed on the upper surfaces of the first gate electrode 105 and first gate insulating layer 104. In other words, the insulating layer 121 is formed between the second gate insulating layer 106 and first gate electrode 105. By thus forming not only the second gate insulating layer 106 but also the insulating layer 121 between the second gate electrode 107 and first gate electrode 105, the parasitic capacitance between the second gate electrode 107 and first gate electrode 105 can be reduced. The insulating layer 121 is also formed between the first gate electrodes 105 adjacent to each other in the second direction.

The insulating layer 121 is formed after the first gate insulating layer 104 and first gate electrodes 105 are formed in the step shown in FIGS. 8 and 9, and before the second gate insulating layer 106 is formed in the step shown in FIGS. 10 and 11.

More specifically, after the step shown in FIGS. 8 and 9, the insulating layer 121 is so formed as to cover the pillar portions 103 and hard masks 102, and to have the upper surface higher than the upper surfaces of the hard masks 102. After that, the insulating layer 121 is processed by CMP so as to have the upper surface leveled with the upper surfaces of the hard masks 102. Then, the insulating layer 121 is processed (etched back) by RIE or wet etching so as to cover the side surface of the central portion of each pillar portion 103 (i.e., the portion between the first and second gate electrodes 105 and 107). After that, the step shown in FIGS. 10 and 11 is performed.

In the third modification as shown in FIG. 16, an epitaxial layer 122 having a planar area larger than that of the pillar portion 103 is formed on it. The planar area of the epitaxial layer 122 is larger than that of the magnetoresistive element 110. A silicide layer 123 is formed on top of the epitaxial layer 122. An interlayer dielectric layer 124 is buried between the epitaxial layers 122 adjacent to each other in the first and second directions, and between the silicide layers 123 adjacent to each other in the first and second directions. The interface resistance between the pillar portion 103 and silicide layer 123 can be reduced by forming the epitaxial layer 122 having a large planar area on the pillar portion 103. Also, the underlayer of the magnetoresistive element 110 becomes uniform because the planar area of the silicide layer 123 (epitaxial layer 122) is large. In other words, the magnetoresistive element 110 is in contact with only the silicide layer 123 as the underlayer. This makes it possible to suppress the variations in characteristics of the magnetoresistive element 110 caused by the influence of the underlayer.

The epitaxial layer 122 is formed after the interlayer dielectric layer 108 is partially removed and before the silicide layer 109 is formed in the step shown in FIGS. 12 and 13.

More specifically, after the upper surface of the interlayer dielectric layer 108 is leveled with the upper surfaces of the pillar portions 103, the epitaxial layer 122 is formed on the upper surface of each pillar portion 103 by epitaxial growth. The epitaxial layer 122 has a crystal structure (e.g., a single crystal) similar to that of the pillar portion 103, and has a planar area larger than that of the pillar portion 103. Then, a metal layer (Co, Ni, or Ti) (not shown) is formed on the upper surface of the epitaxial layer 122. After that, the silicide layer 123 is formed on top of the epitaxial layer 122 by annealing the epitaxial layer 122 and metal layer. The interlayer dielectric layer 124 is formed between the epitaxial layers 122 adjacent to each other in the first and second directions, and between the silicide layers 123 adjacent to each other in the first and second directions. After that, as shown in FIGS. 2 and 3, the magnetoresistive element 110 is formed on the upper surface of the epitaxial layer 122 (silicide layer 123).

In the fourth modification as shown in FIGS. 17 and 18, the bit line BL (interconnection 113) is formed to expand in the first and second directions. That is, the bit line BL is not separated in the second direction, so neither lines nor spaces are formed. The bit line BL is formed in a trench of an interlayer dielectric layer (not shown). In other words, the interlayer dielectric layer is formed around the plate-like bit line BL. The manufacturing process can be facilitated by thus forming the bit line BL into the shape of a plate.

Note that if the cell array region is large and so the planar area of the plate-like bit line BL is large, it becomes difficult to planarize the bit line BL by CMP. In this case, line-and-space bit lines BL are desirably formed as in the abovementioned embodiment. Also, in the above embodiment, the line-and-space bit line BL is formed in contact with a line of the memory cells MC. However, the line-and-space bit line BL may also be formed in contact with two or more lines of the memory cells MC.

Second Embodiment

An MRAM according to the second embodiment will be explained below with reference to FIGS. 19, 20, 21, 22, 23, 24, 25, 26, 27, 28, 29, 30, 31, 32, 33, 34, and 35. In the second embodiment, a source line SL is formed by a plane portion 201 of a semiconductor substrate 200, a selection transistor STA as a vertical transistor including a fin portion 230 of the semiconductor substrate 200 as a channel is formed on the plane portion 201, and a selection transistor STB as a vertical transistor including a pillar portion 203 of the semiconductor substrate 200 as a channel is formed on the fin portion 230. A magnetoresistive element 210 is formed on the selection transistor STB, and a bit line BL (interconnection 213) is formed on the magnetoresistive element 210. This makes it possible to implement an MRAM having a memory cell area of $4F^2$. The second embodiment will be explained in detail below.

Note that in the second embodiment, an explanation of the same features as those of the abovementioned first embodiment will be omitted, and different points will mainly be explained.

Arrangement of Second Embodiment

The arrangement of the MRAM according to the second embodiment will be explained below with reference to FIGS. 19, 20, 21, 22, 23, 24, 25, 26, 27, 28, 29, 30, 31, 32, 33, 34, and 35.

Figure 20:
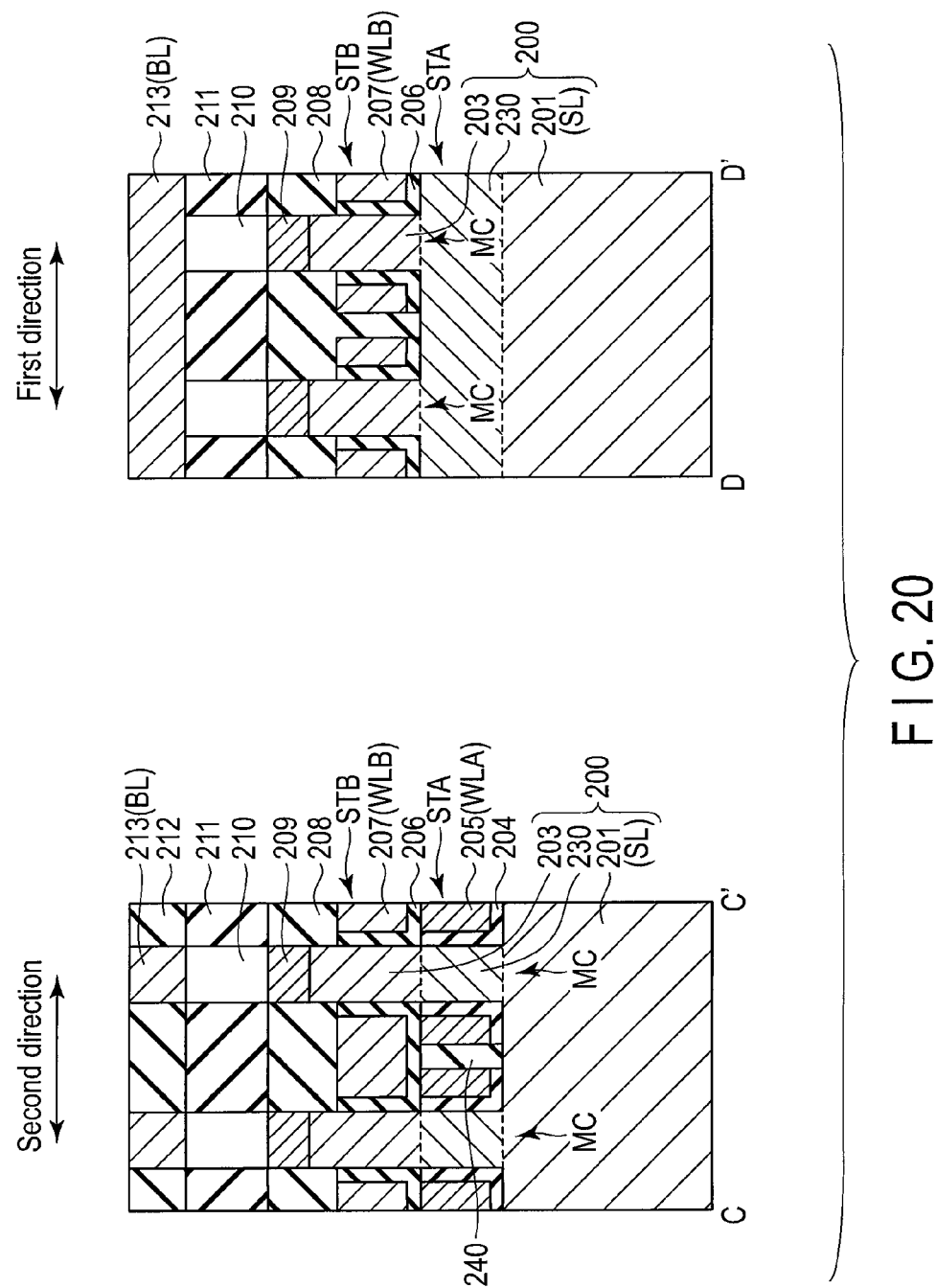
FIG. 20 includes sectional views taken along lines C-C' and D-D' in FIG. 19.

FIG. 19 is a perspective view showing the arrangement of the MRAM according to the second embodiment. FIG. 20 includes sectional views taken along a line C-C' (a second direction) and a line D-D' (a first direction) in FIG. 19. Note that interlayer dielectric layers (to be described later) are not illustrated in FIG. 19.

As shown in FIGS. 19 and 20, the second embodiment differs from the aforementioned first embodiment in that a selection transistor STA is formed by using a fin portion 230 of a semiconductor substrate 200 as a channel.

More specifically, the MRAM according to the second embodiment includes the semiconductor substrate 200, first gate electrodes 205, second gate electrodes 207, magnetoresistive elements 210 as variable-resistance elements, and interconnections 213 as bit lines BL. Thus, a plurality of memory cells MC arranged in a matrix are formed on the semiconductor substrate 200.

The semiconductor substrate 200 includes a plane portion 201 expanding in the first and second directions, a plurality of fin portions 230 expanding in the first direction and a stacking direction on the upper surface of the plane portion 201, and a plurality of pillar portions 203 extending in the stacking direction on the upper surfaces of the fin portions 230. The plurality of fin portions 230 are arranged to form lines and spaces in the second direction. The plurality of pillar portions 203 are arranged in a matrix in the first and second directions. In other words, the plurality of pillar portions 203 are separated in the first and second directions. That is, a plurality of pillar portions 203 arranged in the first direction are formed on the same fin portion 230.

The plane portion 201 has a source region (not shown), and functions as a source line SL. The fin portion 230 has source/drain regions (not shown), and functions as a channel of a selection transistor STA (to be described later). The selection transistors STA adjacent to each other in the first direction share the fin portion 230. That is, the selection transistors STA adjacent to each other in the first direction share the channel. The dimension (width) of the fin portion 230 in the second direction is, e.g., a feature size F of lithography. The pillar portion 203 has source/drain regions (not shown), and functions as a channel of a selection transistor STB (to be described later). The planar size (e.g., the diameter) of the pillar portion 203 is, e.g., equal to or smaller than the feature size F of lithography, like the dimension of the fin portion 230 in the second direction. Accordingly, the fin portions 230 and pillar portions 203 overlap each other in the second direction.

The first gate electrode 205 (a word line WLA) is formed on a first gate insulating layer 204 on the side surface of the fin portion 230 above the plane portion 201. The first gate electrode 205 is so formed as to cover the two side surfaces of the fin portion 230. Also, the first gate electrode 205 continues in the first direction, and is separated in the second direction.

Also, the first gate insulating layer 204 is continuously formed from the side surfaces of the fin portion 230 to the upper surface of the plane portion 201. That is, the first gate electrode 205 is formed on the first gate insulating layer 204 on the upper surface of the plane portion 201. In other words, the first gate insulating layer 204 is formed between the first gate electrode 205 and fin portion 230, and between the first gate electrode 205 and plane portion 201. In addition, an interlayer dielectric layer 240 made of, e.g., $SiO_2$ is formed between two first gate electrodes 205 adjacent to each other in the second direction.

Thus, the fin portion 230, first gate insulating layer 204, and first gate electrode 205 form the selection transistor STA as a vertical transistor.

The second gate electrode 207 is formed on a second gage insulating layer 206 on the side surface of the pillar portion 203 above the first gate electrode 205. The second gate electrode 207 is so formed as to cover the side surface (circumference) of the pillar portion 203. Therefore, the second gate electrode 207 covers the side surfaces of a plurality of pillar portions 203 arranged in the second direction. Also, the second gate electrode 207 continues in the second direction, and is separated in the first direction. In other words, a plurality of second gate electrodes 207 are arranged to form lines and spaces in the first direction.

The second gate insulating layer 206 is continuously formed from the side surface of the pillar portion 203 to the upper surfaces of the first gate electrode 205 and fin portion 230. That is, the second gate electrode 207 is formed on the second gate insulating layer 206 on the upper surfaces of the first gate electrode 205 and fin portion 230. In other words, the second gate insulating layer 206 is formed between the second gate electrode 207 and pillar portion 203, and between the second gate electrode 207 and each of the first gate electrode 205 and fin portion 230.

Thus, the pillar portion 203, second gate insulating layer 206, and second gate electrode 207 form the selection transistor STB as a vertical transistor.

The upper surfaces of the second gate insulating layer 206 and second gate electrode 207 are lower than the upper surface of the pillar portion 203. Accordingly, the pillar portion 203 projects from the second gate insulating layer 206 and second gate electrode 207. A silicide layer 209 is formed on the uppermost portion of the projecting pillar portion 203. An interlayer dielectric layer 208 made of, e.g., $SiO_2$ is buried between the pillar portions 203 (silicide layers 209) adjacent to each other in the first and second directions, and between the second gate electrodes 207 adjacent to each other in the first direction.

The magnetoresistive element 210 is formed on the upper surface of the pillar portion 203 (silicide layer 209), and electrically connected to the pillar portion 203.

An interlayer dielectric layer 211 made of, e.g., $SiO_2$ is buried between the magnetoresistive elements 210 adjacent to each other in the first and second directions.

An interlayer dielectric layer 212 made of, e.g., $SiO_2$ is formed on the magnetoresistive elements 210 and interlayer dielectric layer 211. Interconnections 213 functioning as the bit lines BL are formed in the interlayer dielectric layer 212 so as to be brought into contact with the magnetoresistive elements 210. The bit lines BL continue in the first direction, and are separated in the second direction. Although not shown, the end portions of the plurality of bit lines BL are electrically connected to each other. That is, all the memory cells MC are electrically connected to the bit lines BL.

Manufacturing Method of Second Embodiment

A method of manufacturing the MRAM according to the second embodiment will be explained below with reference to FIGS. 21, 22, 23, 24, 25, 26, 27, 28, 29, 30, 31, 32, 33, 34, and 35.

FIGS. 21, 23, 25, 27, and 29 are perspective views showing the manufacturing steps of the MRAM according to the second embodiment. FIGS. 22, 24, 26, 28, and 30 include sectional views taken along a line C-C' (the second direction) and a line D-D' (the first direction) in FIGS. 21, 23, 25, 27, and 29, respectively. Note that interlayer dielectric layers are not partially illustrated in FIGS. 21, 23, 25, 27, and 29.

Figure 22:
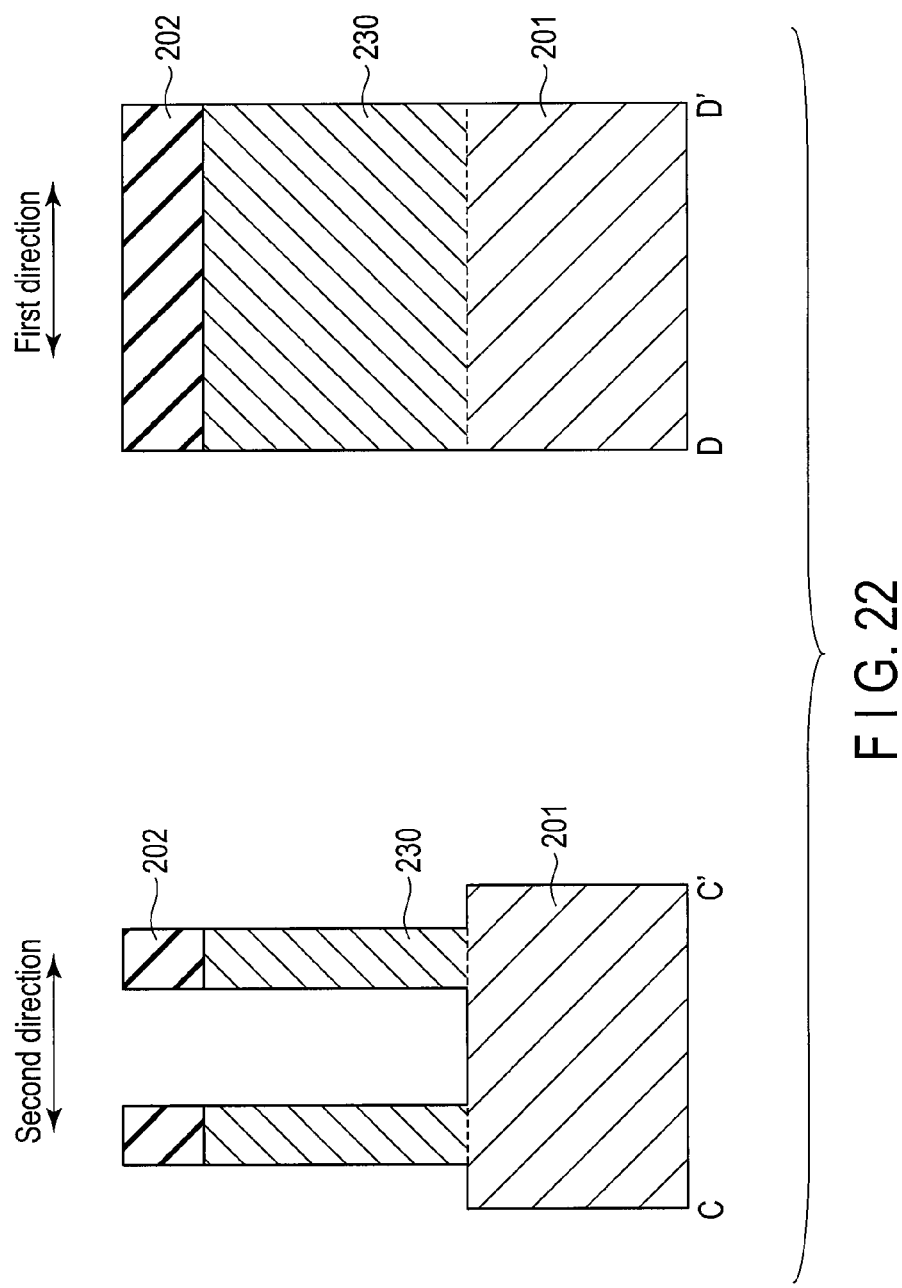

First, as shown in FIGS. 21 and 22, impurity ions are implanted into a semiconductor substrate 200, thereby forming a well region (not shown). Then, impurity ions having a conductivity type different from that of the well region are implanted into the semiconductor substrate 200, thereby forming source/drain regions (not shown). These source/drain regions function as source/drain regions of a selection transistor STB (to be described later), which are formed on the side of a magnetoresistive element 210.

Subsequently, a hard mask 202 made of, e.g., SiN is formed on the semiconductor substrate 200. After a resist (not shown) extending in the first direction is formed on the hard mask 202, the hard mask 202 is patterned by RIE using the resist as a mask. The hard masks 202 extend in the first direction. Then, a portion of the semiconductor substrate 200 is processed by RIE using the resist and hard masks 202 as masks, thereby forming, in the semiconductor substrate 200, a plane portion 201 expanding in the first and second directions, and fin portions 230 expanding in the first direction and stacking direction on the plane portion 201. After that, the resist (not shown) is removed, and impurity ions are implanted into the upper surface of the plane portion 201, thereby forming source/drain regions (not shown). These source/drain regions function as source/drain regions of a selection transistor STA (to be described later), which are formed on the side of the plane portion 201.

Figure 24:
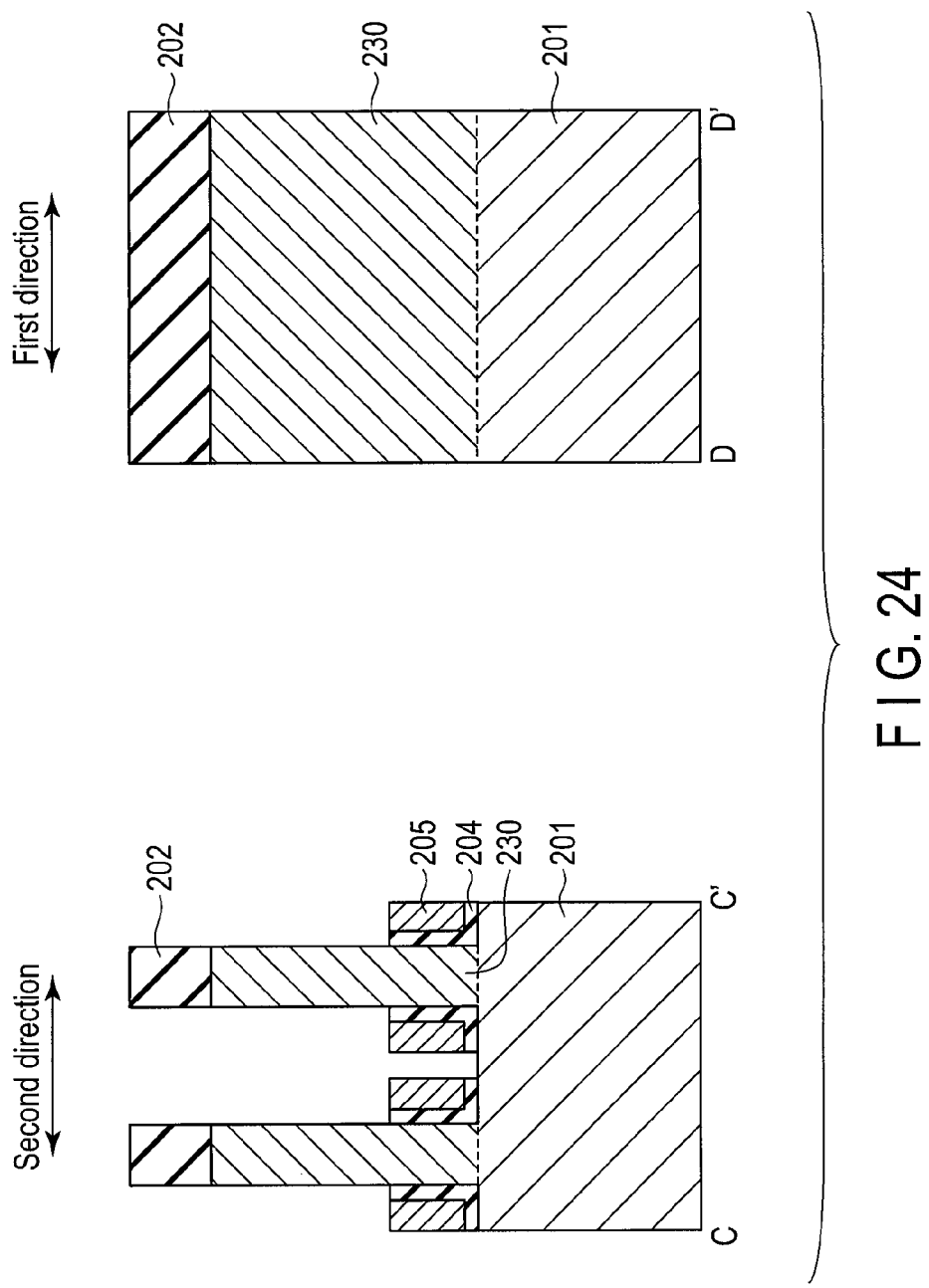

As shown in FIGS. 23 and 24, a first gate insulating layer 204 made of, e.g., an oxide film ($SiO_2$ film) is formed on the upper surface of the plane portion 201 and side surfaces (two side surfaces) of each fin portion 230 by, e.g., thermal oxidation or CVD. A first gate electrode 205 made of, e.g., polysilicon or W is formed on the first gate insulating layer 204. The first gate electrode 205 is so formed as to cover the fin portions 230 and hard masks 202, and to have the upper surface higher than the upper surfaces of the hard masks 202.

Then, the first gate electrode 205 is processed by CMP so as to have the upper surface leveled with the upper surfaces of the hard masks 202. Subsequently, a resist (not shown) extending in the first direction is formed on the first gate electrode 205 and hard masks 202, and the first gate electrode 205 is processed by RIE using this resist as a mask. Consequently, the first gate electrode 205 continues in the first direction, and is separated in the second direction. After that, the resist is removed, and the upper portions of the first gate electrodes 205 are partially removed (etched back) by RIE so that the first gate electrodes 205 cover the two side surfaces of the lower portion of each fin portion 230. In this step, the first gate insulating layer 204 exposed by the removal of the first gate electrodes 205 is also removed.

Thus, the fin portion 230, first gate insulating layer 204, and first gate electrode 205 form a selection transistor STA as a vertical transistor.

As shown in FIGS. 25 and 26, an interlayer dielectric layer 240 made of, e.g., $SiO_2$ is formed by CVD or the like between the fin portions 230 adjacent to each other in the second direction, and between the first gate electrodes 205 adjacent to each other in the second direction. The interlayer dielectric layer 240 is so formed as to have the upper surface higher than the upper surfaces of the hard masks 202, and the upper surface is leveled with the upper surfaces of the hard masks by CMP after that.

Then, a resist (not shown) extending in the second direction is formed on the hard masks 202 and interlayer dielectric layer 240, and the hard masks 202 are patterned by RIE using the resist as a mask. This changes the planar shape of each hard mask 202 into, e.g., a circle. After that, a part of the upper portion of each fin portion 230 (i.e., a part higher than the first gate electrode 205) is processed by RIE using the resist and hard masks 202 as masks. Consequently, pillar portions 203 separated in the first and second directions are formed on the fin portions 230 of the semiconductor substrate 200.

Subsequently, impurity ions are implanted into a region from the upper surface of each fin portion 230 to the side surface of each pillar portion 203, thereby forming source/drain regions (not shown). These source/drain regions function as source/drain regions of the selection transistor STA, which are formed on the side of a magnetoresistive element 210, and as source/drain regions of a selection transistor STB (to be described later), which are formed on the side of the plane portion 201.

As shown in FIGS. 27 and 28, the interlayer dielectric layer 240 is processed by, e.g., RIE. Consequently, the upper surface of the interlayer dielectric layer 240 is leveled with the upper surfaces of the first gate electrodes 205. Then, a second insulating layer 206 made of, e.g., an oxide film ($SiO_2$ film) is formed on the side surfaces of the pillar portions 203 by, e.g., thermal oxidation or CVD. The second gate insulating layer 206 is continuously formed from the side surface of the pillar portion 203 to the upper surface of the first gate electrode 205.

Then, a second gate electrode 207 made of, e.g., polysilicon or W is formed on the second gate insulating layer 206. The second gate electrode 207 is so formed as to cover the pillar portions 203 and hard masks 202, and to have the upper surface higher than the upper surfaces of the hard masks 202.

Subsequently, the second gate electrode 207 is processed by CMP so as to have the upper surface leveled with the upper surfaces of the hard masks 202. A resist (not shown) extending in the second direction is formed on the second gate electrode 207 and hard masks 202, and the second gate electrode 207 is processed by RIE using this resist as a mask. Consequently, the second gate electrode 207 continues in the second direction, and is separated in the first direction. After that, the resist is removed, and the upper portions of the second gate electrodes 207 are partially removed (etched back) by RIE so that the second gate electrodes 207 cover the upper side surfaces of the pillar portions 203. The upper surfaces of the second gate insulating layer 206 and second gate electrodes 207 are formed lower than the upper surfaces of the pillar portions 203. In this step, the second gate insulating layer 206 exposed by the removal of the second gate electrodes 207 is also removed. Then, impurity ions having a conductivity type different from that of the well region are implanted into the pillar portions 203, thereby forming source/drain regions (not shown). After that, the impurity ions are activated by an annealing process.

As shown in FIGS. 29 and 30, an interlayer dielectric layer 208 made of, e.g., $SiO_2$ is buried between the pillar portions 203 adjacent to each other in the first and second directions, and between the second gate electrodes 207 adjacent to each other in the first direction. The interlayer dielectric layer 208 is so formed as to cover the upper surfaces of the hard masks 202. The interlayer dielectric layer 208 is then processed by CMP so as to have the upper surface leveled with the upper surfaces of the hard masks 202. After that, the hard masks 202 are removed by RIE. In addition, the upper portion of the interlayer dielectric layer 208 is partially removed by RIE so that the interlayer dielectric layer 208 has the upper surface leveled with the upper surfaces of the pillar portions 203.

Then, a metal layer (Co, Ni, or Ti) (not shown) is formed on the upper surface of each pillar portion 203. After that, the pillar portion 203 and metal layer are annealed, thereby forming a silicide layer 209 on top of the pillar portion 203.

As shown in FIGS. 19 and 20, a magnetoresistive element 210 is formed on the upper surface of each pillar portion 203 (silicide layer 209). Then, the magnetoresistive element 210 is processed and left behind on the upper surface of the pillar portion 203 by physical etching such as IBE (Ion Beam Etching). After that, an interlayer dielectric layer 211 made of, e.g., $SiO_2$ is buried between the magnetoresistive elements 210 adjacent to each other in the first and second directions.

Subsequently, an interlayer dielectric layer 212 made of, e.g., $SiO_2$ is formed on the magnetoresistive elements 210 and interlayer dielectric layer 211. Trenches reaching the magnetoresistive elements 210 are formed in the interlayer dielectric layer 212. Interconnections 213 functioning as the bit lines BL are formed in these trenches. The bit lines BL continue in the first direction, and are separated in the second direction.

Thus, the MRAM according to the second embodiment is formed.

Effects of Second Embodiment

In the abovementioned second embodiment, the source line SL is formed by the plane portion 201 of the semiconductor substrate 200, the selection transistor STA as a vertical transistor including the fin portion 230 of the semiconductor substrate 200 as a channel is formed on the plane portion 201, and the selection transistor STB as a vertical transistor including the pillar portion 203 of the semiconductor substrate 200 as a channel is formed on the fin portion 230. The magnetoresistive element 210 is formed on the selection transistor STB, and the bit line BL (interconnection 113) is formed on the magnetoresistive element 210.

Accordingly, the same effects as those of the abovementioned first embodiment can be obtained.

In addition, in the second embodiment, the fin portion 230 extending in the first direction functions as the channel of the selection transistor STA. Therefore, the selection transistors STA adjacent to each other in the first direction share the fin portion 230. That is, the selection transistors STA adjacent to each other in the first direction share the channel. Consequently, it is possible to increase the channel area of the selection transistor STA and reduce the parasitic resistance. More specifically, read errors can be suppressed in a read operation by reducing the parasitic resistance. It is also possible to reduce the power consumption in a write operation by reducing the parasitic resistance.

[Modifications]

Modifications of the MRAM according to the second embodiment will be explained below with reference to FIGS. 31, 32, 33, 34, and 35.

Figure 31:
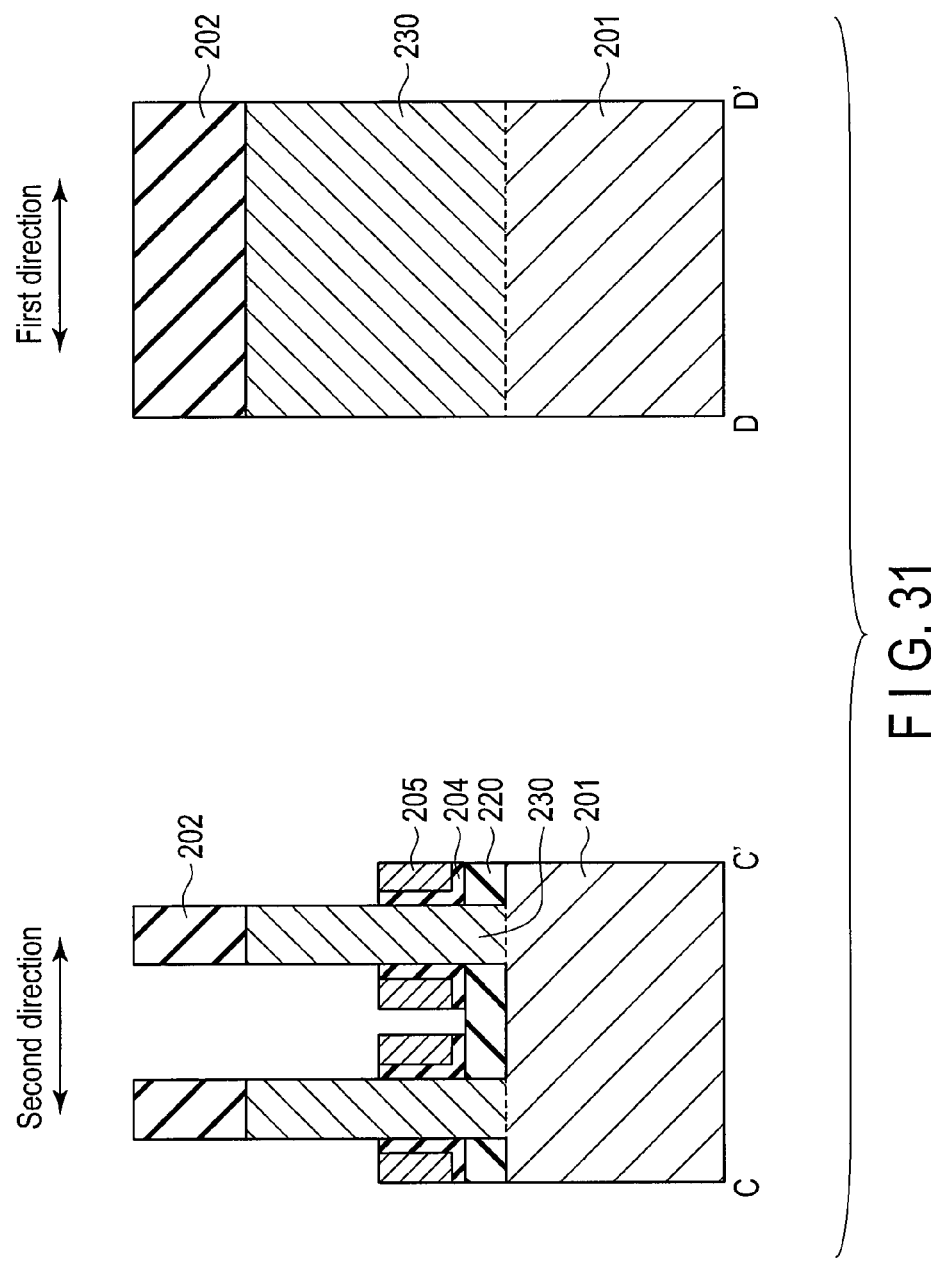
FIG. 31 is a sectional view showing the first modification of the MRAM according to the second embodiment.
Figure 32:
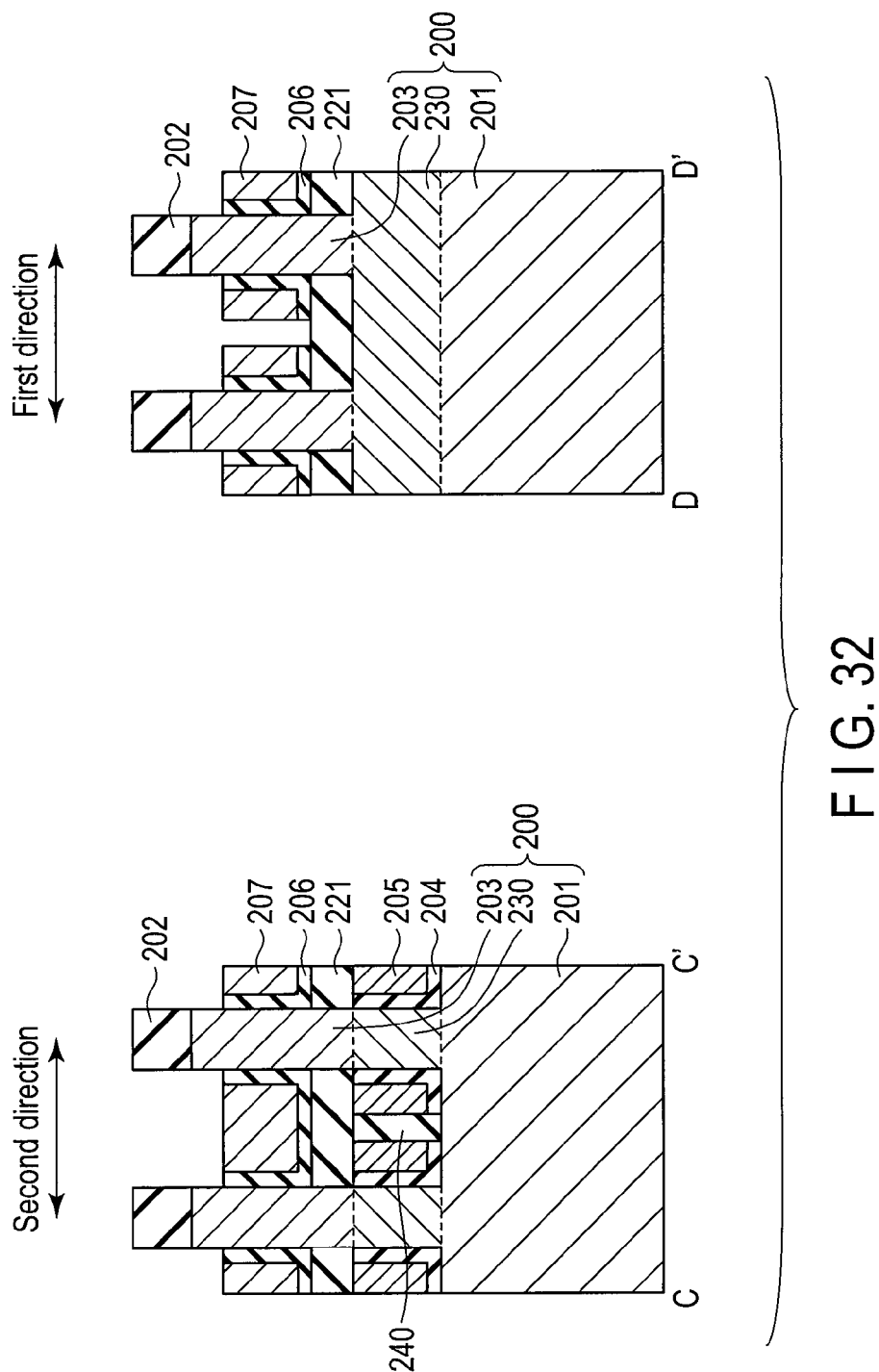
FIG. 32 is a sectional view showing the second modification of the MRAM according to the second embodiment.
Figure 33:
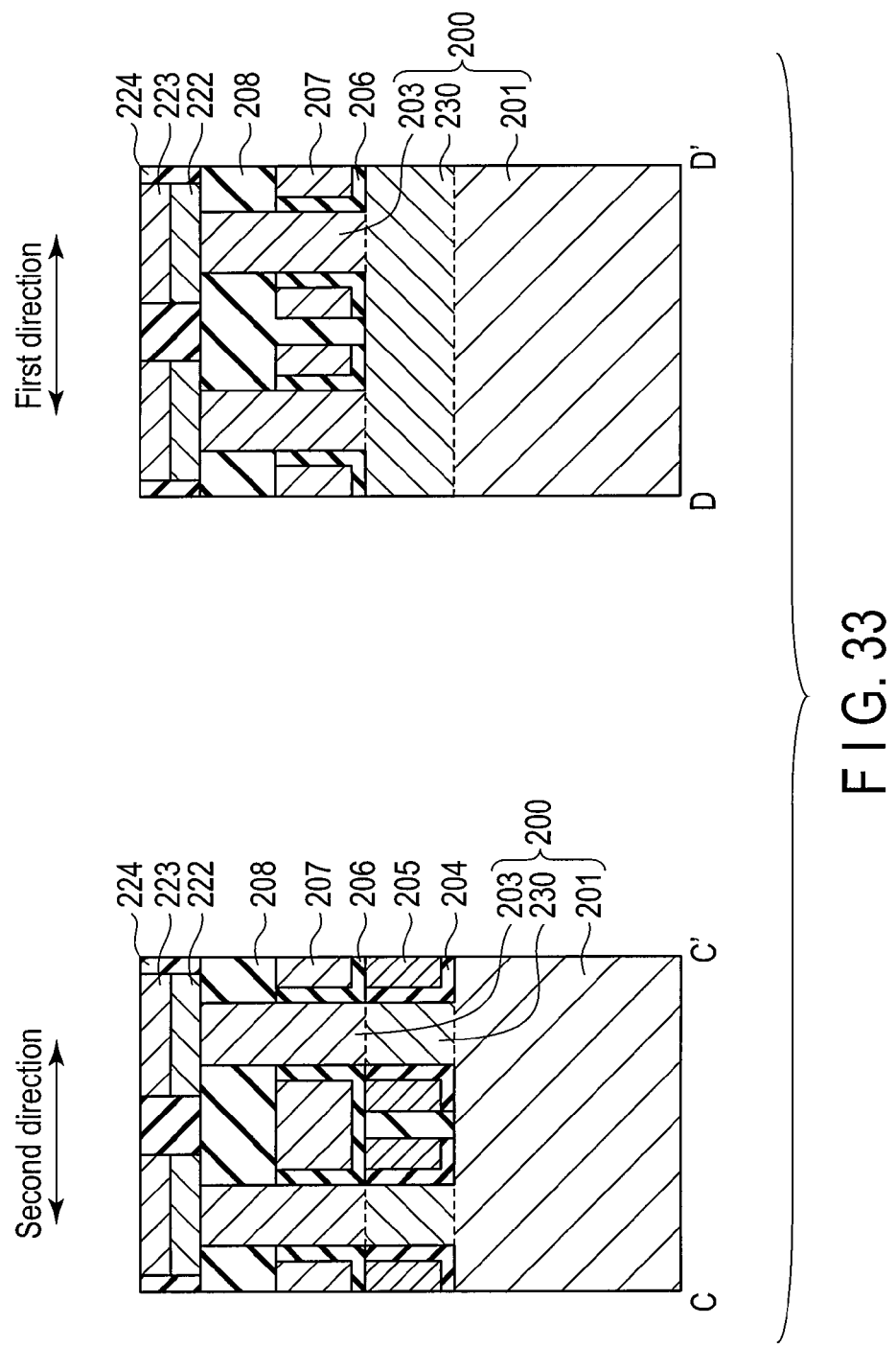
FIG. 33 is a sectional view showing the third modification of the MRAM according to the second embodiment.
Figure 35:
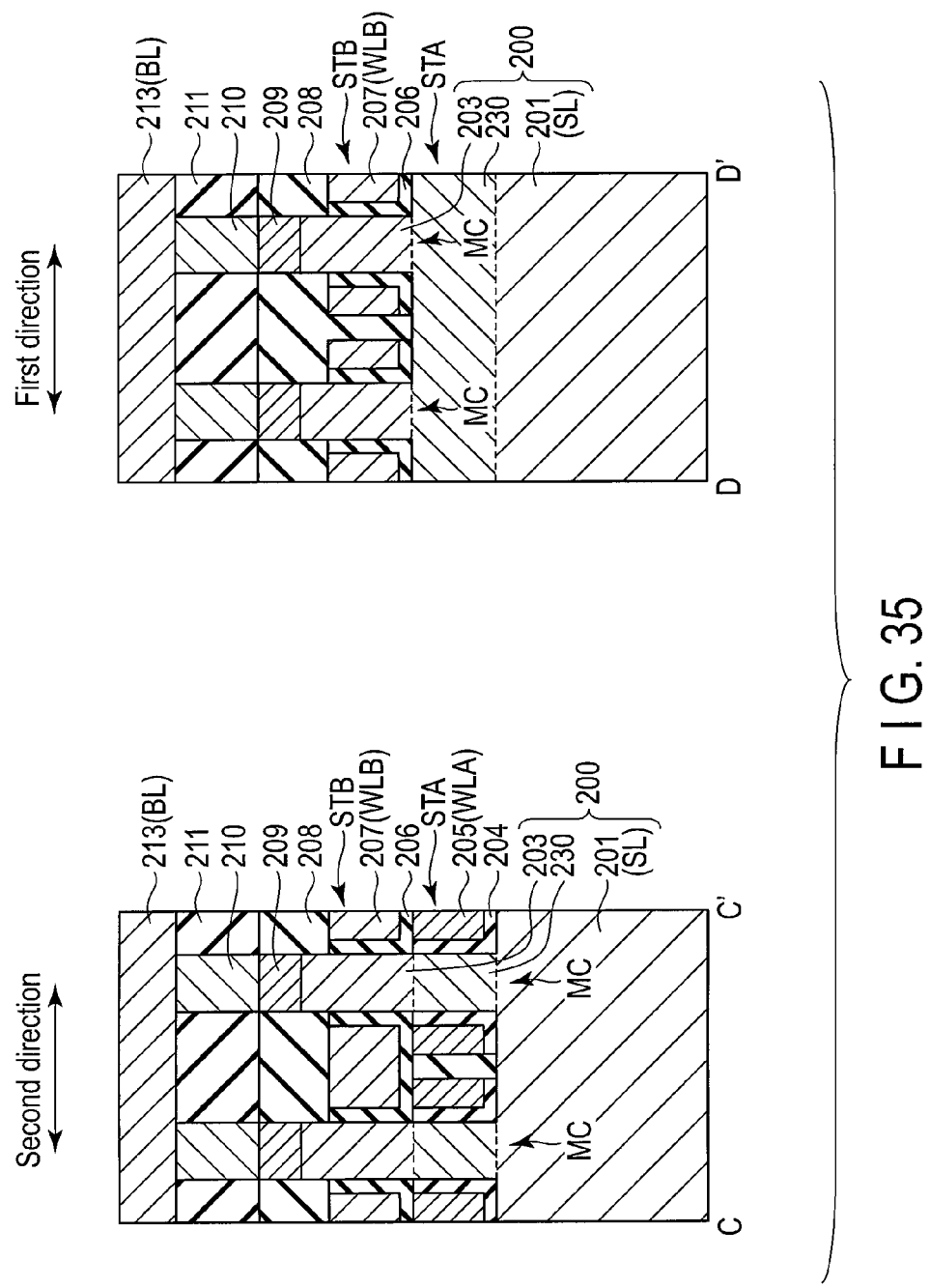
FIG. 35 includes sectional views taken along lines C-C' and D-D' in FIG. 34.

FIG. 31 is a sectional view showing the first modification of the MRAM according to the second embodiment. FIG. 32 is a sectional view showing the second modification of the MRAM according to the second embodiment. FIG. 33 is a sectional view showing the third modification of the MRAM according to the second embodiment. FIG. 34 is a perspective view showing the fourth modification of the MRAM according to the second embodiment. FIG. 35 includes sectional views taken along lines C-C' and D-D' in FIG. 34.

In the first modification as shown in FIG. 31, an insulating layer 220 made of, e.g., $SiO_2$ is formed on the upper surface of the plane portion 201. In other words, the insulating layer 220 is formed between the first gate insulating layer 204 and plane portion 201. By thus forming not only the first gate insulating layer 204 but also the insulating layer 220 between the first gate electrode 205 and plane portion 201, the parasitic capacitance between the first gate electrode 205 and plane portion 201 can be reduced.

The insulating layer 220 is formed after the plane portion 201 is formed and the fin portions 230 are formed on the plane portion 201 in the step shown in FIGS. 21 and 22, and before the first gate insulating layer 204 is formed in the step shown in FIGS. 23 and 24.

More specifically, after the step shown in FIGS. 21 and 22, the insulating layer 220 is so formed as to cover the fin portions 230 and hard masks 202, and to have the upper surface higher than the upper surfaces of the hard masks 202. After that, the insulating layer 220 is processed by CMP so as to have the upper surface leveled with the upper surfaces of the hard masks 202. Then, the insulating layer 220 is processed (etched back) by RIE or wet etching so as to cover the lower side surfaces of the fin portions 230. After that, the step shown in FIGS. 23 and 24 is performed.

In the second modification as shown in FIG. 32, an insulating layer 221 made of, e.g., $SiO_2$ is formed on the upper surfaces of the first gate electrode 205 and first gate insulating layer 204. In other words, the insulating layer 221 is formed between the second gate insulating layer 206 and first gate electrode 205. By thus forming not only the second gate insulating layer 206 but also the insulating layer 221 between the second gate electrode 207 and first gate electrode 205, the parasitic capacitance between the second gate electrode 207 and first gate electrode 205 can be reduced.

The insulating layer 221 is formed after the interlayer dielectric layer 240 is formed and before the second gate insulating layer 206 is formed in the step shown in FIGS. 27 and 28.

More specifically, after the interlayer dielectric layer 240 is processed to have the upper surface leveled with the upper surfaces of the first gate electrodes 205 in the step shown in FIGS. 27 and 28, the insulating layer 221 is so formed as to cover the pillar portions 203 and hard masks 202. The upper surface of the insulating layer 221 is made higher than the upper surfaces of the hard masks 202. After that, the insulating layer 221 is processed by CMP so as to have the upper surface leveled with the upper surfaces of the hard masks 202. Then, the insulating layer 221 is processed (etched back) by RIE or wet etching so as to cover the lower side surfaces of the pillar portions 203. After that, the second gate insulating layer 206 shown in FIGS. 27 and 28 is formed.

In the third modification as shown in FIG. 33, an epitaxial layer 222 having a planar area larger than that of the pillar portion 203 is formed on it. The planar area of the epitaxial layer 222 is larger than that of the magnetoresistive element 210. A silicide layer 223 is formed on top of the epitaxial layer 222. An interlayer dielectric layer 224 is buried between the epitaxial layers 222 adjacent to each other in the first and second directions and between the silicide layers 223 adjacent to each other in the first and second directions. The interface resistance between the pillar portion 203 and silicide layer 223 can be reduced by forming the epitaxial layer 222 having a large planar area on the pillar portion 203. Also, the underlayer of the magnetoresistive element 210 becomes uniform because the planar area of the silicide layer 223 (epitaxial layer 222) is large. In other words, the magnetoresistive element 210 is in contact with only the silicide layer 223 as an underlayer. This makes it possible to suppress the variations in characteristics of the magnetoresistive element 210 caused by the influence of the underlayer.

The epitaxial layer 222 is formed after the interlayer dielectric layer 208 is partially removed and before the silicide layer 209 is formed in the step shown in FIGS. 29 and 30.

More specifically, after the upper surface of the interlayer dielectric layer 208 is leveled with the upper surfaces of the pillar portions 203, the epitaxial layer 222 is formed on the upper surface of each pillar portion 203 by epitaxial growth. The epitaxial layer 222 has a crystal structure similar to that of the pillar portion 203, and has a planar area larger than that of the pillar portion 203. Then, a metal layer (Co, Ni, or Ti) (not shown) is formed on the upper surface of the epitaxial layer 222. After that, the silicide layer 223 is formed on top of the epitaxial layer 222 by annealing the epitaxial layer 222 and metal layer. The interlayer dielectric layer 224 is formed between the epitaxial layers 222 adjacent to each other in the first and second directions, and between the silicide layers 223 adjacent to each other in the first and second directions. After that, as shown in FIGS. 19 and 20, the magnetoresistive element 210 is formed on the upper surface of the epitaxial layer 222 (silicide layer 223).

In the fourth modification as shown in FIGS. 34 and 35, the bit line BL (interconnection 213) is formed to expand in the first and second directions. That is, the bit line BL is not separated in the second direction, so neither lines nor spaces are formed. The bit line BL is formed in a trench of an interlayer dielectric layer (not shown). In other words, the interlayer dielectric layer is formed around the plate-like bit line BL. The manufacturing process can be facilitated by thus forming the bit line BL into the shape of a plate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a semiconductor substrate including a plane portion extending in a first direction and a second direction perpendicular to the first direction, and a pillar portion formed on an upper surface of the plane portion and extending in a stacking direction;
   a first gate electrode formed on a first gate insulating layer on a lower side surface of the pillar portion, the first gate electrode surrounding a lower portion of the pillar portion and extending in the first direction;
   a second gate electrode formed on a second gate insulating layer on an upper side surface of the pillar portion, the second gate electrode surrounding an upper portion of the pillar portion and extending in the second direction;
   a variable-resistance element formed on an upper surface of the pillar portion; and
   an interconnection formed on an upper surface of the variable-resistance element.

2. The device of claim 1, wherein the variable-resistance element comprises:
   a storage layer as a ferromagnetic layer having a variable magnetization direction;
   a reference layer as a ferromagnetic layer having an invariable magnetization direction; and
   a tunnel barrier layer as a nonmagnetic layer formed between the storage layer and the reference layer.

3. The device of claim 1, wherein the lower portion of the pillar portion, the first gate insulating layer, and the first gate electrode form a first selection transistor, and the upper portion of the pillar portion, the second gate insulating layer, and the second gate electrode form a second selection transistor.

4. The device of claim 3, wherein when performing various operations on the variable-resistance element, a potential difference is produced between the plane portion and the interconnection while the first selection transistor and the second selection transistor are turned on.

5. The device of claim 1, further comprising an insulating layer formed between the first gate electrode and the plane portion.

6. The device of claim 1, further comprising an insulating layer formed between the second gate electrode and the first gate electrode.

7. The device of claim 1, further comprising an epitaxial layer formed between the pillar portion and the variable-resistance element, and having a planar area larger than a planar area of each of the pillar portion and the variable-resistance element.

8. The device of claim 1, wherein the interconnection extends in the first direction.

9. The device of claim 1, wherein the interconnection extends in the first direction and the second direction.

* * * * *